(12) United States Patent
Roizin et al.

(10) Patent No.: US 7,439,575 B2
(45) Date of Patent: Oct. 21, 2008

(54) PROTECTION AGAINST IN-PROCESS CHARGING IN SILICON-OXIDE-NITRIDE-OXIDE-SILICON (SONOS) MEMORIES

(75) Inventors: Yakov Roizin, Afula (IL); Efraim Aloni, Migdal Haemek (IL); Micha Gutman, Migdal Haemek (IL); Menachem Vofsy, Midgal Haemek (IL); Avi Ben-Gigi, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 11/065,312

(22) Filed: Feb. 23, 2005

(65) Prior Publication Data
US 2005/0139903 A1  Jun. 30, 2005

Related U.S. Application Data

(62) Division of application No. 10/659,031, filed on Sep. 9, 2003, now Pat. No. 6,959,920.

(51) Int. Cl.
*H01L 29/792* (2006.01)

(52) U.S. Cl. ............... 257/324; 257/E21.679; 257/E23.114

(58) Field of Classification Search .......... 257/E23.114, 257/324, E21.679
See application file for complete search history.

(56) References Cited

U.S. PATENT DOCUMENTS

| | | | |
|---|---|---|---|
| 3,743,847 A | 7/1973 | Boland | |
| 5,051,793 A | 9/1991 | Wang | |
| 5,168,334 A * | 12/1992 | Mitchell et al. | 257/324 |
| 5,424,569 A * | 6/1995 | Prall | 257/324 |
| 5,825,059 A | 10/1998 | Kuroda | |
| 6,081,456 A | 6/2000 | Dadashev | |
| 6,181,597 B1 | 1/2001 | Nachumovsky | |
| 6,256,231 B1 | 7/2001 | Lavi | |

(Continued)

FOREIGN PATENT DOCUMENTS

JP   2001-284563   12/2001

OTHER PUBLICATIONS

"Mechanism of Charge Induced Plasma Damage to EPROM Cells During Fabrication of Integrated Circuits", by C.K. Barlingay, R. Yach & W. Likaszek; 7th Int'l. Symposium on Plasma- and Process-Induced Damage, Jun. 2002, Hawaii.

(Continued)

*Primary Examiner*—Andy Huynh
(74) *Attorney, Agent, or Firm*—Bever, Hoffman & Harms; E. Eric Hoffman

(57) ABSTRACT

A pre-metal dielectric structure of a SONOS memory structure includes a UV light-absorbing film, which prevents the ONO structure from being electronically charged in response to UV irradiation. In one embodiment, the pre-metal dielectric structure includes a first pre-metal dielectric layer located over the SONOS memory structure, a light-absorbing structure located over the first pre-metal dielectric layer, and a second pre-metal dielectric layer located over the light-absorbing structure. The light-absorbing structure can be a continuous polysilicon or amorphous silicon layer. Alternately, the light-absorbing structure can include one or more patterned polysilicon layers. In another embodiment, the SONOS transistors include UV light absorbing polysilicon spacers.

8 Claims, 19 Drawing Sheets

U.S. PATENT DOCUMENTS

| | | | |
|---|---|---|---|
| 6,297,173 B1 * | 10/2001 | Tobin et al. | 438/778 |
| 6,410,210 B1 * | 6/2002 | Gabriel | 430/315 |
| 6,440,797 B1 | 8/2002 | Wu et al. | |
| 6,680,509 B1 | 1/2004 | Wu et al. | |
| 6,765,254 B1 | 7/2004 | Hui et al. | |
| 6,765,259 B2 * | 7/2004 | Kim | 257/315 |
| 6,774,432 B1 * | 8/2004 | Ngo et al. | 257/325 |
| 2004/0046215 A1 | 3/2004 | Hasunuma et al. | |

OTHER PUBLICATIONS

"Avoiding Plasma Induced Damage To Gate Oxide Wtih Conductive Top Film (CTF) on PECVD Contact Etch Stop Layer", by S. Song et al., 2002 Symposium On VLSI Technology Digest of Technical Papers.

* cited by examiner

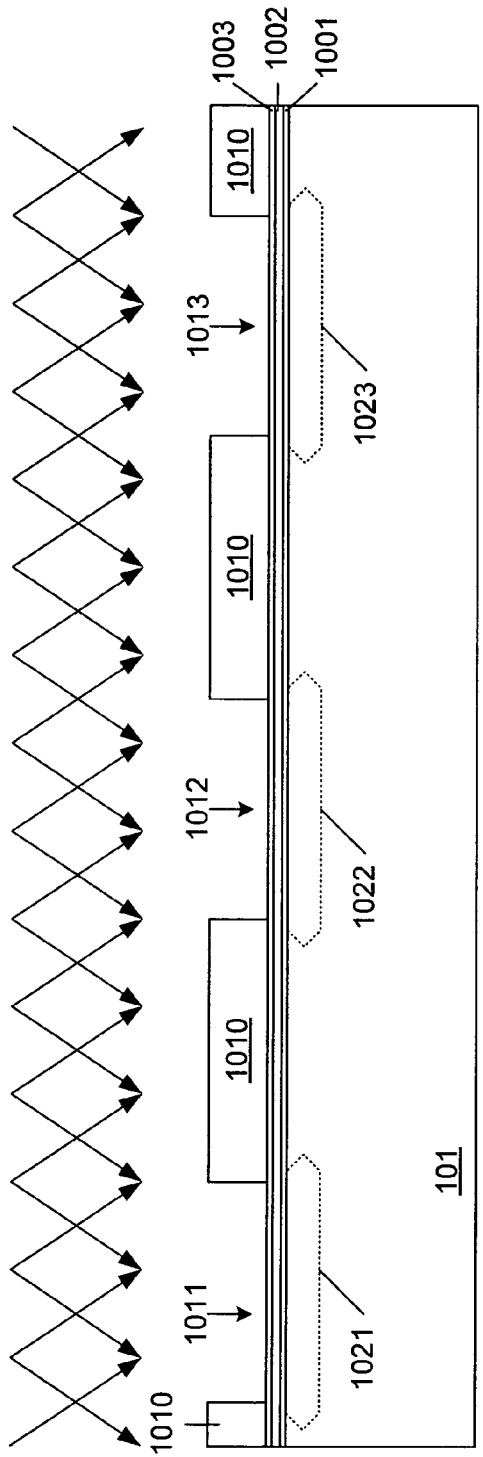
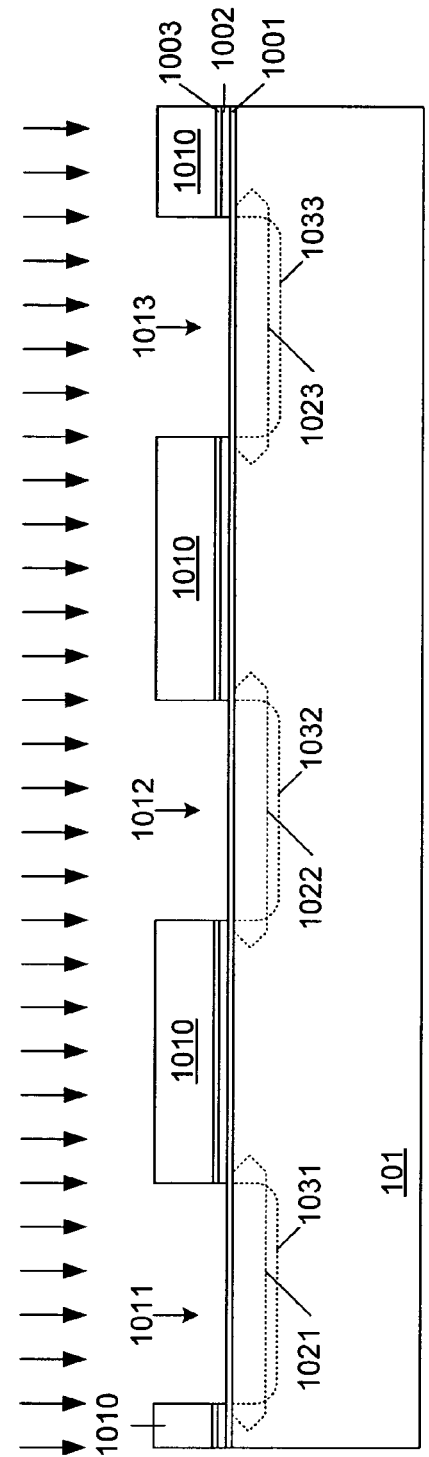
FIG. 7A
FIG. 7B

PROTECTION AGAINST IN-PROCESS CHARGING IN SILICON-OXIDE-NITRIDE-OXIDE-SILICON (SONOS) MEMORIES

RELATED APPLICATION

This application is a divisional of U.S. patent application Ser. No. 10/659,031 entitled "Protection Against In-Process Charging In Silicon-Oxide-Nitride-Oxide-Silicon (SONOS) Memories" filed Sep. 9, 2003.

FIELD OF THE INVENTION

The present invention relates to a method for decreasing the charging effects in the silicon nitride layer of an ONO structure.

RELATED ART

FIG. 1 is an isometric view of a portion of a conventional fieldless array 100, which includes a plurality of 2-bit non-volatile memory transistors arranged in a plurality of rows and columns. Fieldless array 100 exhibits a cross-point pattern, as illustrated. A fieldless array is defined as an array that does not use field oxide to isolate the various elements of the array. Because field oxide is not required to isolate the memory transistors in a fieldless array, the memory transistors can be laid out with a relatively high density.

Fieldless array 100 includes 2-bit non-volatile memory transistor 110, which is identified by dashed lines in FIG. 1. The 2-bit non-volatile memory transistors located in a fieldless array will hereinafter be referred to as "fieldless array transistors". FIG. 2A is a cross sectional view of fieldless array transistor 110 along section line A-A' of FIG. 1. FIG. 2B is a cross sectional view of fieldless array transistor 110 along section line B-B' of FIG. 1.

Fieldless array 100 includes a plurality of n-type diffusion bit lines 141-143 that extend in parallel along a first axis of semiconductor region 101. Semiconductor region 101 is, for example, p-type monocrystalline silicon. Each of the diffusion bit lines 141-143 is covered by a corresponding bit line oxide layer 151-153. Oxide-Nitride-Oxide (ONO) structures 161-163 extend in parallel along the first axis, between adjacent diffusion bit lines. For example, ONO structure 161 is located between diffusion bit lines 141 and 142, with the ends of ONO structure 161 extending over the edges of diffusion bit lines 141-142 and the edges of bit line oxide layers 151-152. ONO structure 161, which is shown in more detail in FIG. 2A, includes lower silicon oxide layer 11, silicon nitride layer 12 and upper silicon oxide layer 13. Polycide word lines 170 and 180 extend in parallel along a second axis that is perpendicular to the first axis. Polycide word line 170 includes conductively doped polycrystalline silicon (polysilicon) layer 171 and metal silicide layer 172. Similarly, polycide word line 180 includes conductively doped polysilicon layer 181 and metal silicide layer 182. Note that fieldless array transistor 110 includes a silicon-oxide-nitride-oxide-silicon (SONOS) structure that includes substrate 101, ONO layer 161 and polysilicon layer 171.

Diffusion bit lines 141 and 142 form the source and drain, respectively, of fieldless array transistor 110. Diffusion bit lines 141 and 142 also form the source and drain, respectively, of an adjacent transistor that includes polycide word line 180 and ONO structure 161. Thus, the sources and drains of the fieldless array transistors extend laterally beyond the gates of these transistors. Furthermore, diffusion bit line 142 also forms the source in another adjacent fieldless array transistor, which includes polycide word line 170, ONO structure 162 and diffusion bit line 143 (which forms the drain of this adjacent transistor).

An insulating material, such as dielectric sidewall spacers, or gap filling oxide, can be formed between the polycide word lines 170 and 180. Dashed lines 191-192 illustrate the general location of dielectric sidewall spacers associated with polycide word line gate 170. Dashed lines 193 and 194 illustrate the general location of gap filling oxide associated with polycide word line 170.

The operation of fieldless array 100 is described in more detail in U.S. Pat. Nos. 6,256,231 B1, 6,181,597 and 6,081,456. In general, a first data bit is stored in charge trapping region 21 in silicon nitride layer 12, and a second data bit is stored in charge trapping region 22 of silicon nitride layer 12. Programming is performed by channel hot electrons (CHE) that are trapped in charge trapping regions 21 and 22 of silicon nitride layer 12 at the drain junction edge. Holes, created by band-to-band tunneling (BBT) in drain regions 141-142 erase the associated programmed bits. Fieldless array transistor 110 is read in the reverse direction of programming.

The narrow channel effects (NCE) in a 2-bit fieldless array transistor are much stronger than in standard MOS devices. Narrow channel effects cause the threshold voltage (Vt) of a transistor to increase as the width of the transistor channel decreases. The observed threshold voltage (Vt) increase is related to the process ultra-violet (UV) irradiation, which results in charging of the ONO layer at the edges of fieldless array transistors.

In-process charging is a well-known phenomenon in non-volatile memory cells having polysilicon floating gates. Ultra-violet initialization is usually employed to decrease the charge of the electrons trapped in the polysilicon floating gate. In contrast, exposure of a silicon-oxide-nitride-oxide-silicon (SONOS) structure to UV irradiation, leads to an increase in electronic charge trapped in the ONO layer.

FIG. 3 is a schematic diagram illustrating the charging process associated with electron excitation from the valence band of silicon. Electrons overcome the potential barrier at the interface of the silicon substrate 101 and the lower silicon oxide layer 11, and are trapped in the silicon nitride layer 12. These electrons are manifested as a threshold voltage (Vt) increase in the associated fieldless array transistor 110. UV radiation is always present in the plasma and implantation processes of integrated circuit fabrication. Thus, a certain degree of charging is always present in the silicon nitride of an ONO layer.

In fieldless array 100, the polysilicon etch that forms polysilicon regions 171 and 181 stops at the upper oxide layer (e.g., oxide layer 13) of the associated ONO structures (e.g., ONO structure 161). When the dielectric sidewall spacers 191-192 or gap-filling oxide 193-194 is subsequently formed, the ONO structure 161 remains untouched under these dielectric spacers or gap-filling oxide. FIG. 4A is a cross sectional view along section line B-B' of FIG. 1, illustrating dielectric sidewall spacers 191-192 after LDD etch back (spacer formation). Note that ONO layer 161 remains untouched under spacers 191-192. FIG. 4B is a cross sectional view along section line B-B' of FIG. 1, illustrating gap filling oxide 193-194. ONO layer 161 remains untouched under gap filling oxide 193-194.

FIGS. 4A and 4B also illustrate the manner in which silicon nitride layer 12 is charged in response to UV irradiation. Valence band electrons excited in silicon substrate 101 are trapped in silicon nitride layer 12 at the edges of fieldless array transistor 110. Also, electrons from the conduction band of strongly doped n+ polysilicon word line 171 can be excited and trapped in silicon nitride layer 12 of ONO layer 161. These trapped electrons result in threshold voltage roll-off for narrow fieldless array transistors (i.e., transistors having a narrow width along the first axis of FIG. 1). Note that polysilicon region 171 effectively blocks the UV radiation from reaching the channel region of fieldless array transistor 110.

FIG. 5 is a graph of that illustrates the relationship between threshold voltage increase and polysilicon word line width at the metal-1 (M1) process stage and the end of line (EOL) process stage. Note that the threshold voltage increases dramatically as the width of the polysilicon word line decreases below 0.4 microns.

Subsequent bakes (up to 475° C.) can only partially reduce the charge trapped in silicon nitride layer 12.

There are two reasons why charging the nitride layer in a SONOS fieldless array transistor is dangerous. First, there are a limited number of traps in the silicon nitride layer. If some of these traps are already occupied (due to UV irradiation), programming the fieldless array transistor to a higher threshold voltage level results in two high densities of electron charge in a certain volume. Some of the electrons occupy states with lower activation energy. The trapped charges also strongly repulse. The memory retention performance is thus degraded. Second, degradation effects can occur at the Si-SiO$_2$ interface when negative charge is trapped in the floating gate after 400° C. H$_2$ bakes. (See, C. K. Barlingay, Randy Yach, Wes Lukaszek, "Mechanism Of Charge Induced Plasma Damage To EPROM Cells", 7$^{th}$ Symposium on Plasma and Process Induced Damage, June 2002 Hawaii.) This also results in enhanced retention loss. FIG. 6 is a graph illustrating the data retention loss (defined by the threshold voltage Vt in millivolts) after 10 k program/erase cycles and a 250° C./24 hour bake for a wafer at the metal-1 stage, a wafer at the end-of-line stage, and a wafer at the metal-1 stage with an additional 30 minutes of UV exposure. As illustrated in FIG. 6, data retention loss increases as UV exposure increases.

It would therefore be desirable to have a method and structure for decreasing the threshold voltage of fieldless array transistors as the widths of these transistors decrease.

SUMMARY

Accordingly, the present invention provides a SONOS memory structure, wherein a pre-metal dielectric layer located between the ONO structure and the first metal layer includes a light-absorbing structure, which prevents the ONO structure from being electronically charged in response to UV irradiation. The requirements/desirable properties of the light-absorbing structure are as follows. First, the light-absorbing structure must efficiently block UV light. Second, the fabrication of the light-absorbing structure should be compatible with a core CMOS process. Third, the light-absorbing structure should only require minimum changes to the memory array parameters. For example, the light-absorbing structure should only introduce a minimum capacitive coupling to the memory array. Fourth, the light-absorbing structure should require a minimum number of additional masks. In one embodiment, the light-absorbing structure is polycrystalline silicon (polysilicon).

In accordance with one embodiment, the SONOS memory structure includes a semiconductor substrate, a plurality of ONO structures formed over the semiconductor substrate, and a plurality of word lines formed over the ONO structures. A thin silicon nitride barrier layer is formed over the resulting structure, in accordance with conventional processing techniques. A first pre-metal dielectric layer is formed over the silicon nitride barrier layer. This first pre-metal dielectric layer can be, for example, USG or BPSG. The light-absorbing structure is then formed over the first pre-metal dielectric layer. The light-absorbing structure can be, for example, a solid polysilicon layer, an amorphous silicon layer, or a patterned polysilicon or amorphous silicon layer. Alternately, combinations of two or more patterned polysilicon layers with one or more intermediate dielectric layers can be used. In this embodiment, the patterned polysilicon layers can be horizontally shifted to maximize the light blocking capabilities of the resultant structure.

A second pre-metal dielectric layer is then formed over the light-absorbing structure. The second pre-metal dielectric layer can be, for example, BPSG.

A photoresist mask, which defines the locations of the various contacts, is then formed over the second pre-metal dielectric layer. An etch is performed through the photoresist mask, thereby creating contact openings through the second pre-metal dielectric layer, the light-absorbing structure and the first pre-metal dielectric layer. This etch is stopped on the silicon nitride barrier layer.

In one embodiment an oxidation step is then performed, thereby creating an insulating oxide on the exposed sidewalls of the light-absorbing structure that were exposed by the etch. The etch is then continued, thereby removing the exposed portions of the silicon nitride barrier layer.

A thin barrier layer (e.g., Ti/TiN) is deposited into the contact openings. The contact openings are then filled with a contact metal, such as tungsten or aluminum. The contacts are isolated from the light-absorbing film by the insulating oxide formed on the exposed sidewalls of the light-absorbing film. Note that the oxidation step of the exposed sidewalls of the light absorbing structure is not necessary if the polysilicon or amorphous silicon layer of the light absorbing structure has a high specific resistance (typically >10$^9$ Ohm/sq at maximum operation temperature)

In another embodiment of the present invention, a thin dielectric film, such as tetra-ethoxy-silane oxide (TEOS), is deposited over the semiconductor structure formed by the semiconductor substrate, the ONO structures, and the word lines. A polysilicon layer is deposited over the TEOS film, and then etched back, thereby forming polysilicon spacers adjacent to the word lines. The polysilicon spacers, in combination with polysilicon word lines, substantially block UV light from reaching the substrate during subsequent processing steps. Note that in this embodiment, the ONO structures must be removed under the polysilicon spacers. Otherwise, the ONO structure could be programmed through capacitive coupling between the each word line and the associated polysilicon spacers.

The present invention will be more fully understood in view of the following description and drawings.

BRIEF DESCRIPTION OF THE DRAWINGS

FIGS. 7A-7E are cross sectional views of the fieldless array of FIG. 1 along section line AA-AA' of FIG. 1 during conventional processing steps.

DETAILED DESCRIPTION

The present invention will now be described with respect to the conventional fieldless array 100 of FIG. 1. Although the present invention is described with respect to fieldless array 100, it is understood that the present invention is also applicable to other SONOS memory structures. Moreover, although a small portion of fieldless array 100 is illustrated, one of ordinary skill in the art would be able to expand this fieldless array by following the pattern disclosed in FIG. 1.

As described in more detail below, a pre-metal dielectric structure, which includes a light-absorbing structure, is formed over the conventional fieldless array 100. This light-absorbing structure blocks UV radiation from reaching substrate 101 during subsequent processing steps (i.e., during formation of the multi-layer interconnect structure). As a result, the UV radiation cannot cause significant electronic charge to be transferred from the silicon substrate 101 to the silicon nitride layer of ONO structures 161-163. Consequently, the initial threshold voltages of the fieldless array transistors do not increase to undesirable levels.

The fabrication of fieldless array 100, and the overlying pre-metal dielectric structure of the present invention, will now be described in accordance with one embodiment of the present invention.

Figure 1:
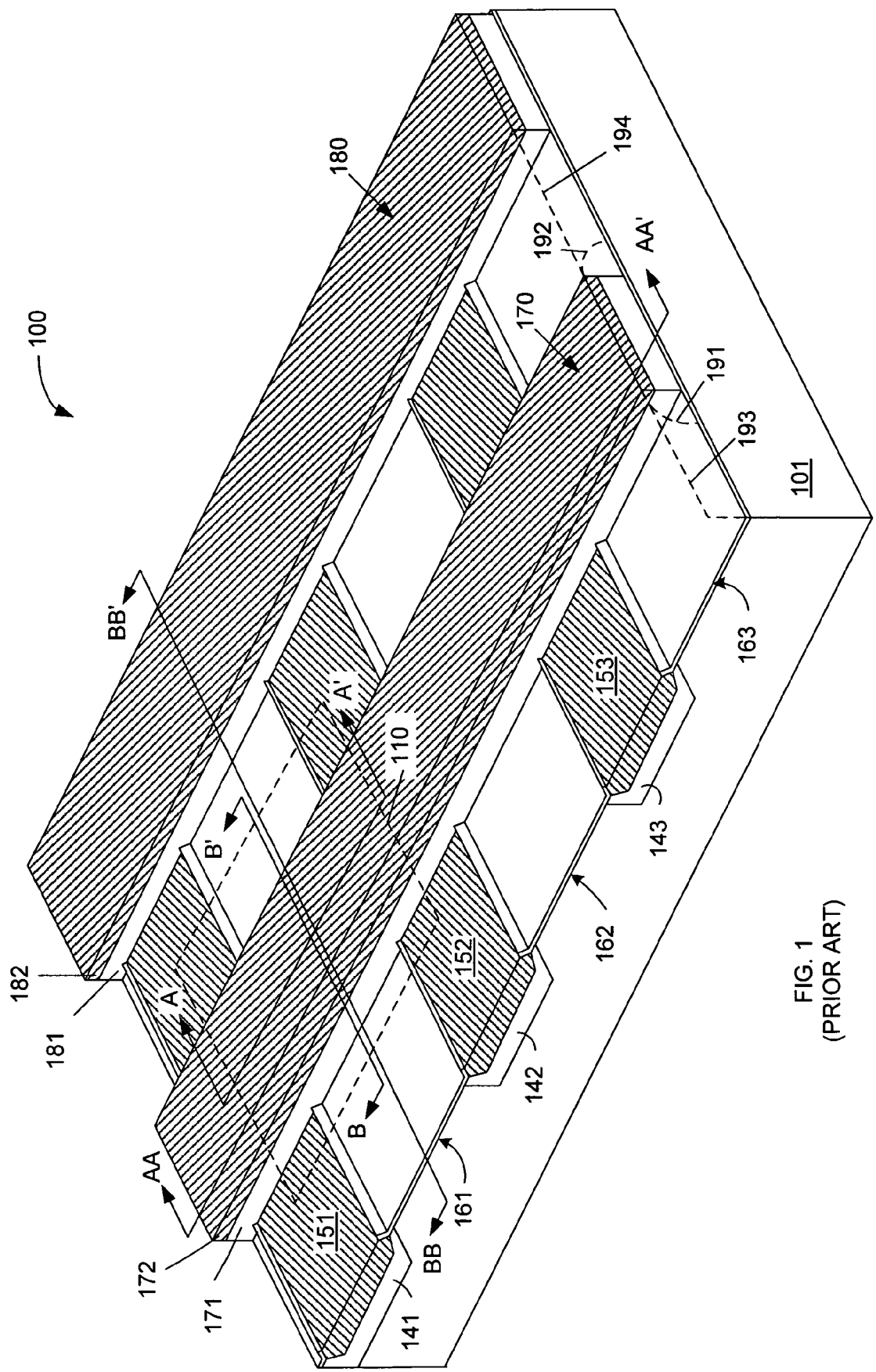
FIG. 1 is an isometric view of a portion of a conventional fieldless array, which includes a plurality of 2-bit non-volatile memory transistors arranged in a plurality of rows and columns.
Figure 2A:
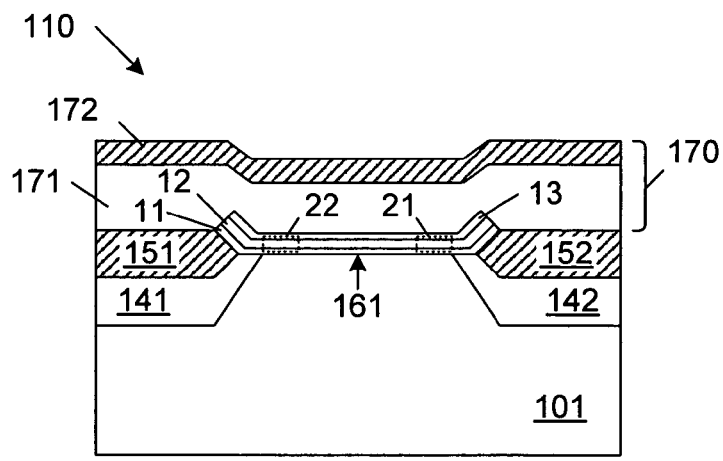
FIG. 2A is a cross sectional view of a fieldless array transistor along section line A-A' of FIG. 1.
Figure 2B:
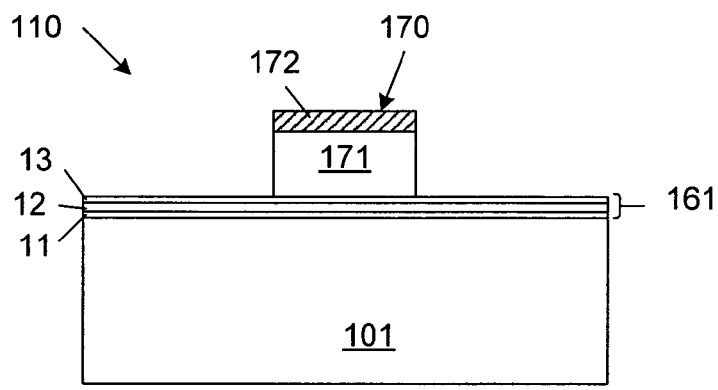
FIG. 2B is a cross sectional view of a fieldless array transistor along section line B-B' of FIG. 1.
Figure 3:
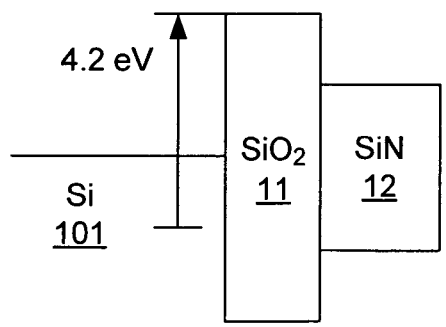
FIG. 3 is a schematic diagram illustrating the charging process associated with electron excitation from the valence band of silicon.
Figure 4A:
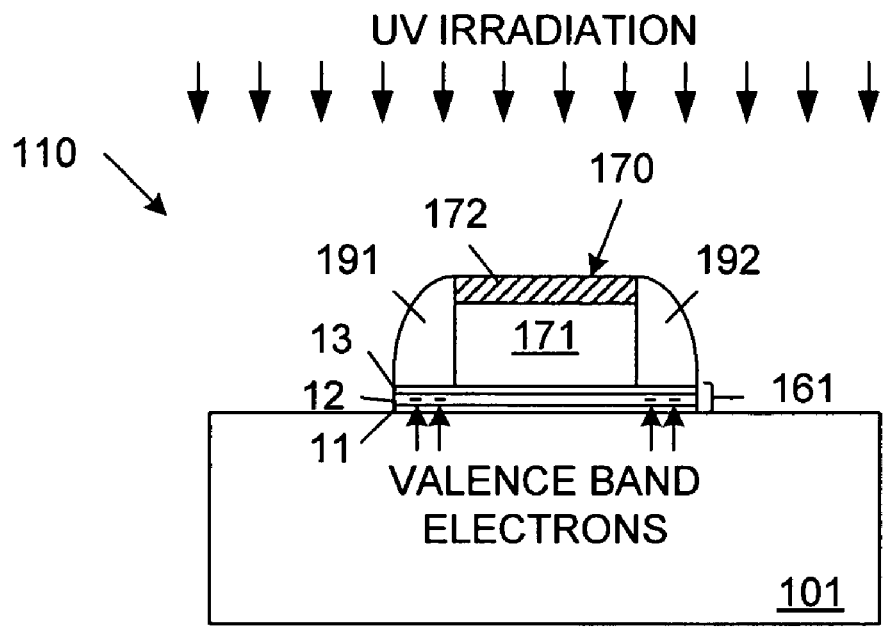
FIGS. 4A and 4B are cross sectional view of a fieldless array transistor along section line B-B' of FIG. 1, which illustrate the manner in which a silicon nitride layer is charged in response to UV irradiation.
Figure 4B:
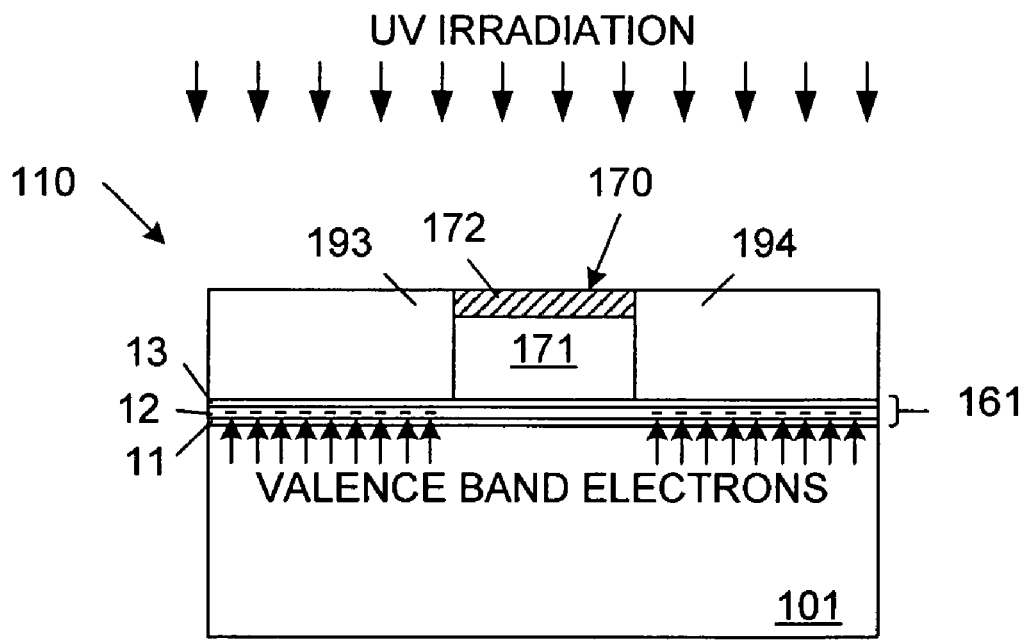
Figure 5:
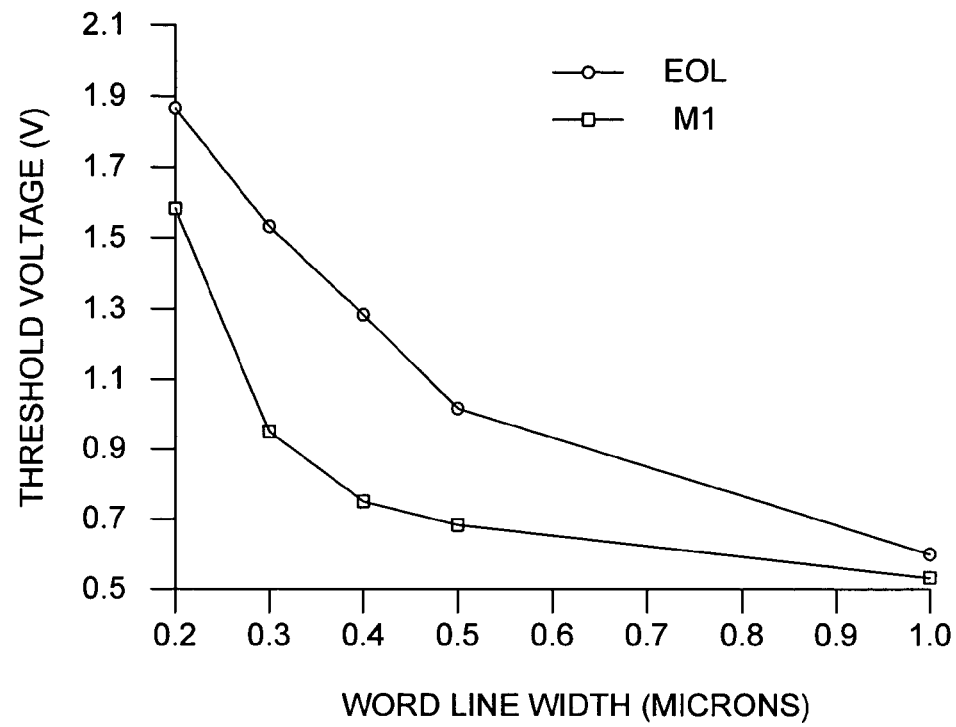
FIG. 5 is a graph of that illustrates the relationship between threshold voltage increase and polysilicon word line width at a metal-1 (M1) process stage and an end of line (EOL) process stage.
Figure 6:
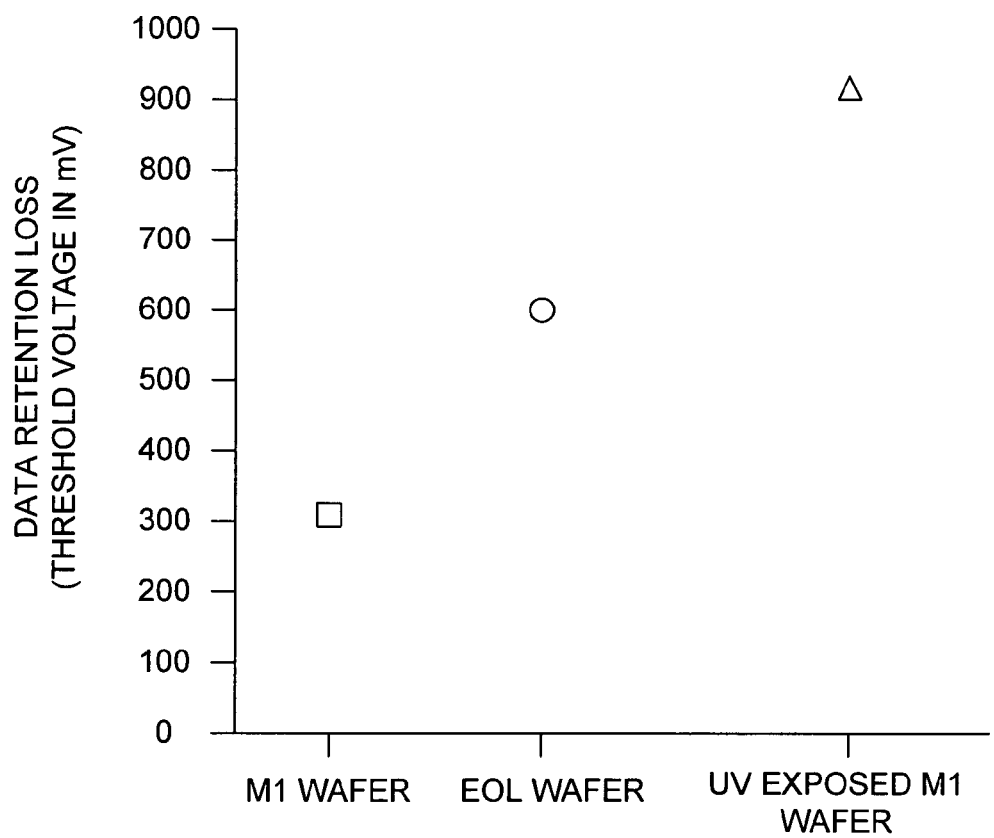
FIG. 6 is a graph illustrating data retention loss at the EOL stage after 10 k program/erase cycles and a 250° C./24 hour bake, compared with the data retention loss after the same procedure at the M1 stage.

FIGS. 7A-7E are cross sectional views of fieldless array 100 along section line AA-AA' of FIG. 1 during various process steps. FIGS. 8A-8E are cross sectional views of fieldless array 100 along section line BB-BB' of FIG. 1 during various process steps.

The described process is a twin-well process. Initially, the high voltage n-wells are formed within semiconductor substrate 101, followed by the low voltage n-wells and the p-wells. These well regions are not illustrated in the Figures for purposes of clarity. In the described embodiment, fieldless array 100 is fabricated in a p-type region of a monocrystalline silicon substrate.

As illustrated in FIG. 7A, lower silicon oxide layer 1001 is deposited or created on the surface of semiconductor substrate 101. A floating gate silicon nitride layer 1002 is then deposited on the upper surface of lower silicon oxide layer 1001. Then, an upper silicon oxide layer 1003 is either deposited or created on floating gate silicon nitride layer 1002.

A layer of photoresist is then deposited over the upper surface of silicon oxide layer 1003. This photoresist layer is exposed and developed to create a photoresist mask 1010 having openings 1011-1013, as illustrated in FIG. 7A. Openings 1011-1013 are located to define the locations of diffusion bit lines 141-143, respectively, of fieldless array 100. High angle implants are then performed through openings 1011-1013. More specifically, a P-type impurity, such as boron, is implanted through openings 1011-1013 of photoresist mask 1010 at acute and obtuse angles with respect to the surface of semiconductor substrate 101, such that the dopant extends under the edges of photoresist mask 1010. The implanted boron serves to adjust the threshold voltages of the fieldless array transistors. An additional n-type counter-doping implant can also be implemented (using similar parameters) to improve junction edge optimization. The high-angle implanted P-type (N-type) impurities are illustrated as regions 1021-1023 in FIG. 7A.

As illustrated in FIG. 7B, after performing the high angle implants, the portions of upper silicon oxide layer 1003 and silicon nitride layer 1002 that are exposed by openings 1011-1013 are removed. In one embodiment, these layers are removed by a two step dry etch, which is performed by a low pressure, high-density plasma etcher. In one embodiment, both steps are isotropic etches that use non-directed plasma. As a result, zero proximity effect (micro-loading) is achieved, and ion bombardment is reduced to a minimum level.

An N-type impurity, such as arsenic, is then implanted through openings 1011-1013 of photoresist mask 1010. The implanted N-type impurities are illustrated as regions 1031-1033 in FIG. 7B. These N-type impurities have a higher concentration than the previously implanted P-type impurities, such that the N-type impurities subsequently form the source/drain regions of the fieldless array transistors.

Figure 7C:
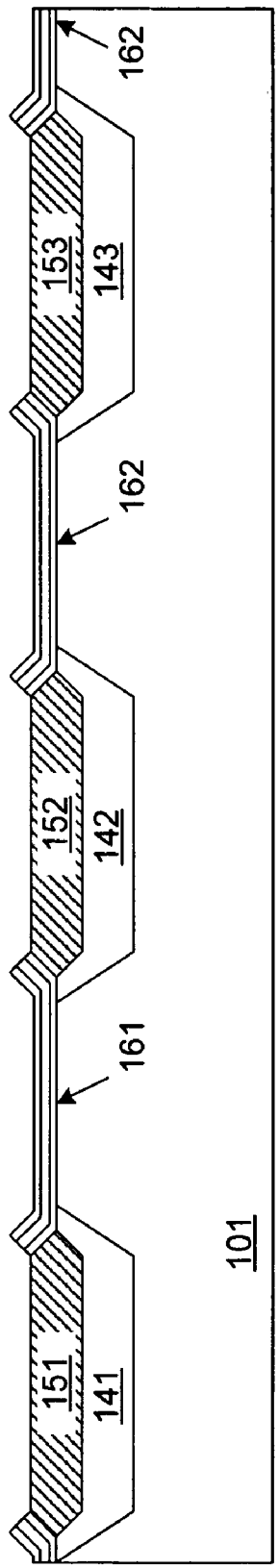

As illustrated in FIG. 7C, photoresist mask 1010 is then stripped, and a thermal oxidation step is performed, thereby creating bit line oxide regions 151-153. The growth of bit line oxide regions 151-153 causes the ends of silicon nitride layer 1002 and silicon oxide layer 1003 which are adjacent to bit line oxide regions 151-153 to bend upward, thus forming ONO structures 161-163. Note that ONO structures 161-163 extend the entire width of fieldless array 100, along the first axis. In one embodiment, bit line oxide is thermally grown to a thickness in the range of 400 to 850 Angstroms using a wet oxidation process. This oxidation step also activates and diffuses the implanted impurities in regions 1021-2023 and 1031-1033, thereby forming diffusion bit lines 141-143.

Figure 7D:
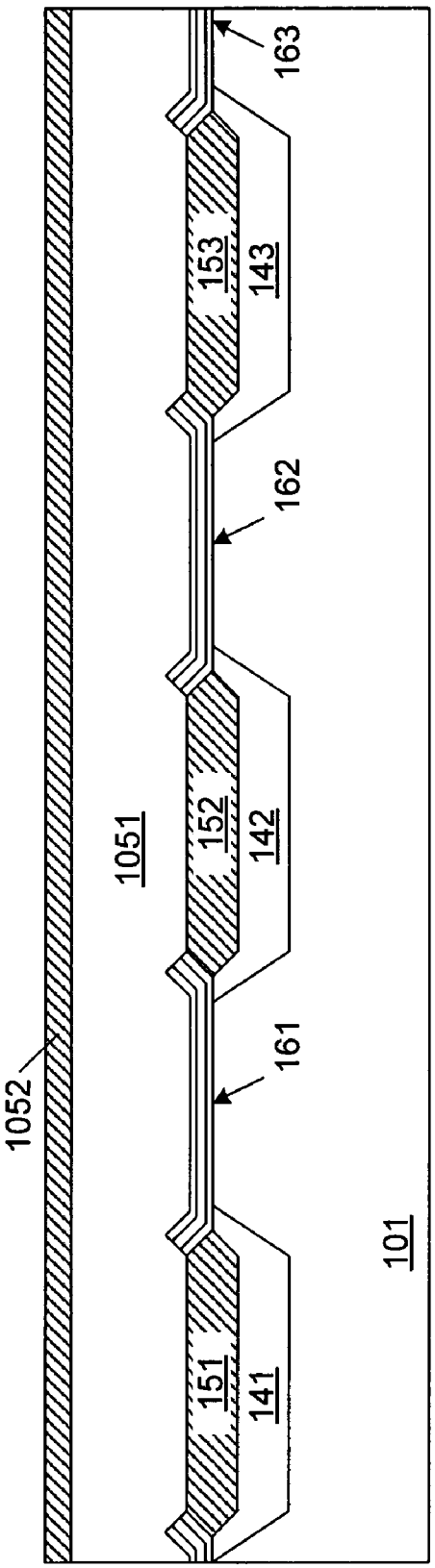
Figure 8A:
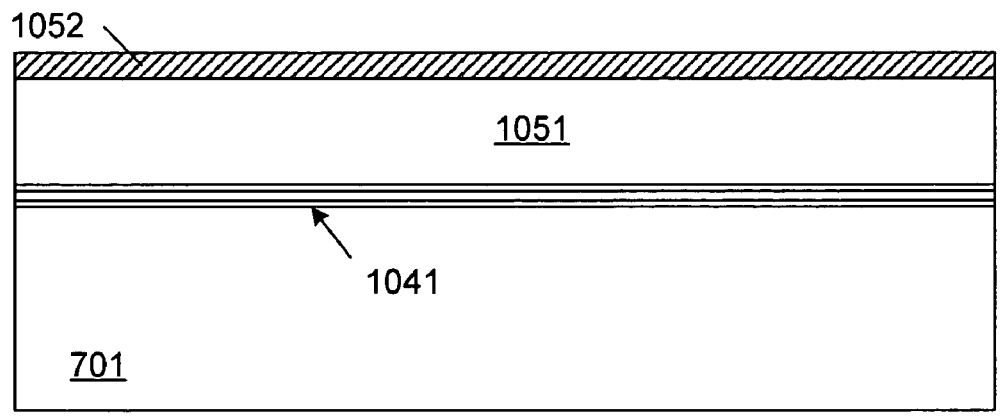
FIGS. 8A-8C are cross sectional views of the fieldless array of FIG. 1 along section line BB-BB' of FIG. 1 during conventional process steps.

As illustrated in FIGS. 7D and 8A, a blanket layer of conductively doped polysilicon 1051 is then formed over the upper surface of the resulting structure. A layer of metal silicide is deposited directly on polysilicon layer 1051 to form metal silicide layer 1052. In an alternate embodiment, a blanket layer of a refractory metal, such as tungsten, titanium, or cobalt, is sputtered over the upper surface of polysilicon layer 1051. In yet another embodiment, metal silicide is not formed over polysilicon layer 1051.

Figure 7E:
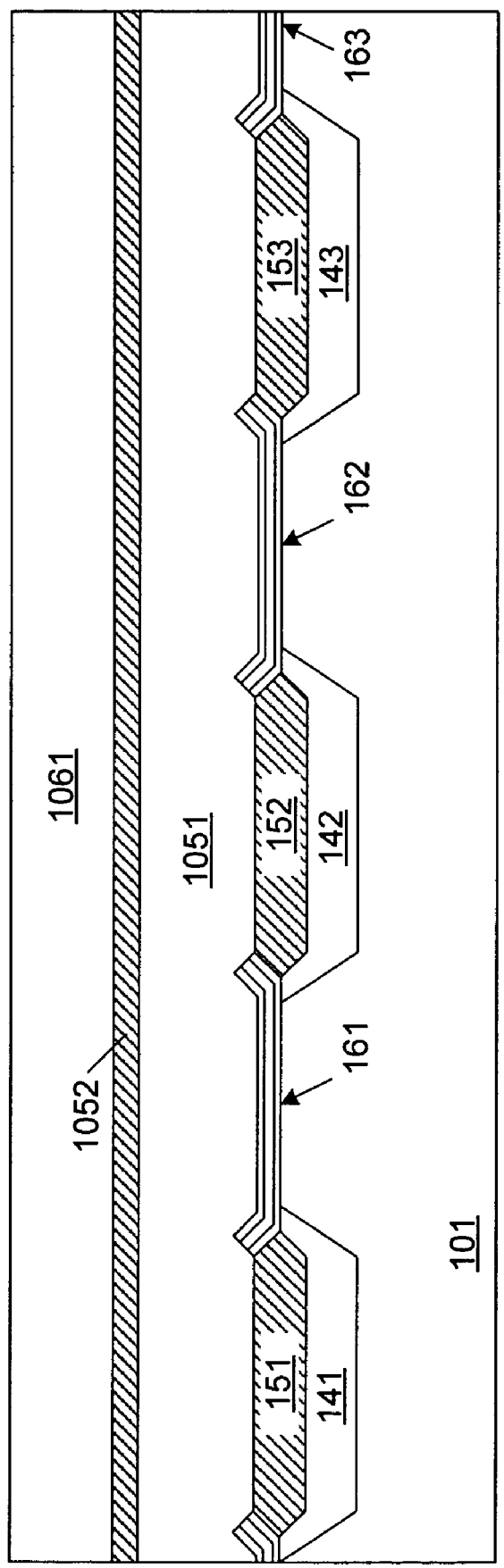
Figure 8B:
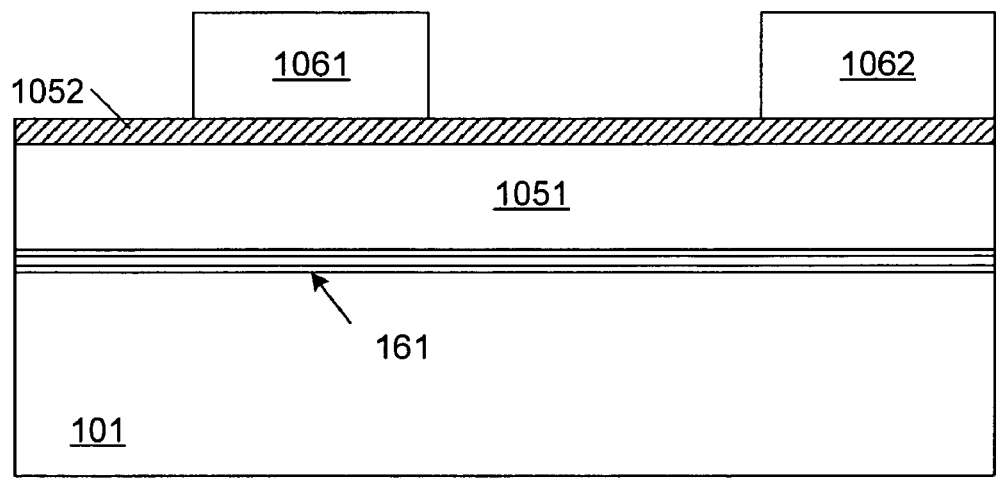

A layer of photoresist is then deposited over the resulting structure. This photoresist layer is exposed and developed to form a photoresist mask, which includes photoresist regions 1061-1062 as illustrated in FIGS. 7E and 8B. Photoresist regions 1061 and 1062 define the locations of word lines 170 and 180, respectively, of fieldless array 100.

Figure 8C:
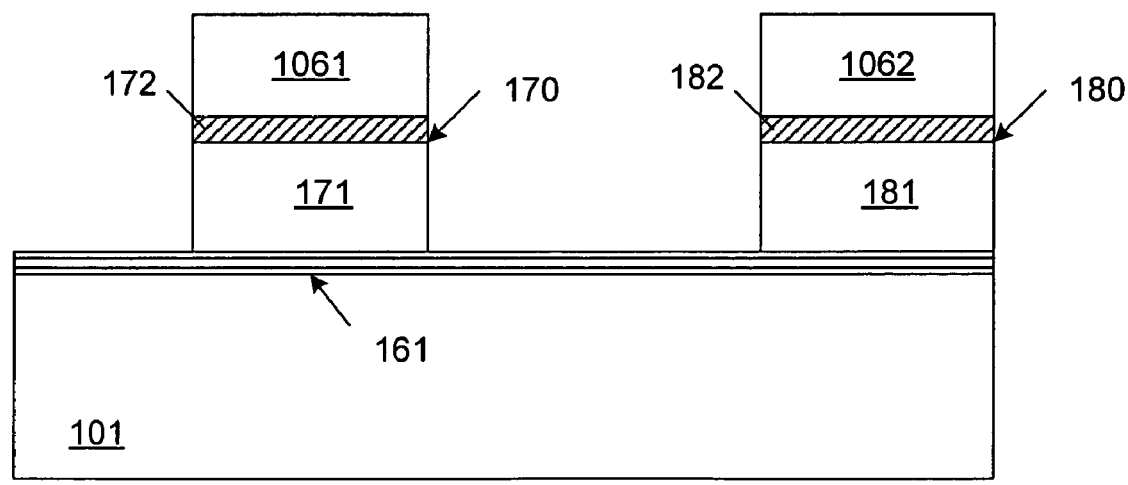

As illustrated in FIG. 8C, an etch is then performed to remove the portions of metal silicide layer 1052 and polysilicon layer 1051 that are exposed by photoresist regions 1061-1062. As a result, word lines 170 and 180 are formed.

Figure 8D:
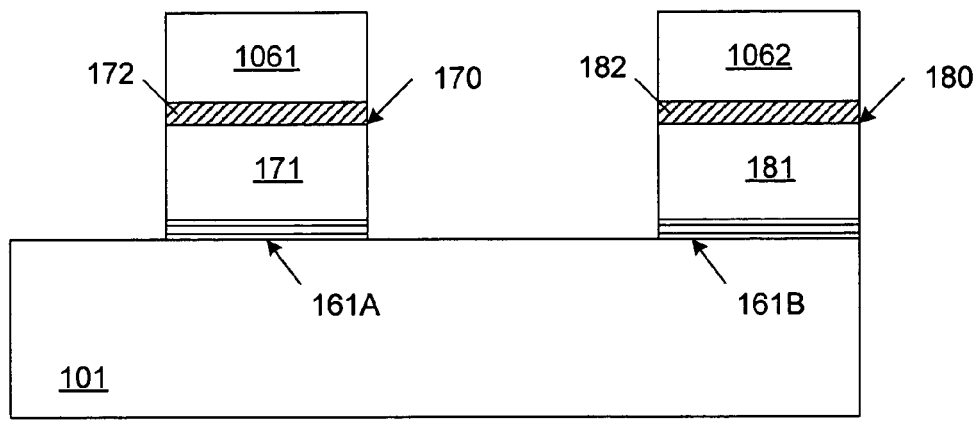
FIGS. 8D-8E are cross sectional views of the fieldless array along section line BB-BB' of FIG. 1 during process steps in accordance with one embodiment of the present invention.

In accordance with one embodiment of the present invention, the exposed portions of ONO structures 161-163 are then removed between word lines 170 and 180, as illustrated in FIG. 8D. ONO structures 161-163 can be etched in various manners, including: prolonging a polysilicon RIE etch, performing a series of plasma etches, or performing a wet ONO etch. ONO structures are etched until the exposed portions of upper silicon oxide layer 1003 and silicon nitride layer 1002 are removed. Portions of lower silicon oxide layer 1001 may or may not remain after the etch step. At the end of the ONO etch, ONO structures 161A and 161B remain under word lines 170 and 180, respectively. These ONO structures 161A and 161B are located entirely under the word lines 170 and 180, respectively.

After the polycide etch and ONO etches are completed, photoresist regions 1061-1062 are stripped and a metal silicide anneal is then performed. This anneal adheres the metal silicide to the underlying polysilicon and is part of the activation of the impurities in the buried diffusion bit lines 141-143. A boron implant can then be performed to prevent current leakage between diffusion bit lines at the locations between adjacent gates electrodes in the fieldless array. This boron implant is a blanket implant, with no mask protection provided on the wafer.

Figure 8E:
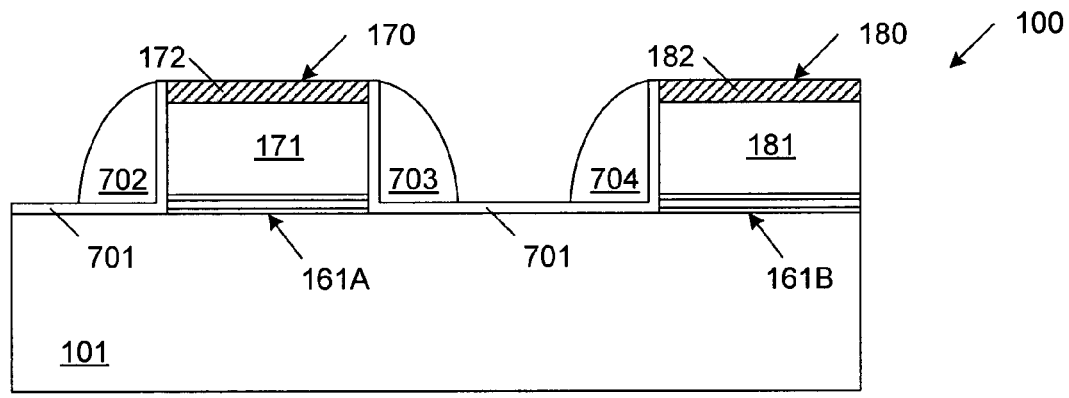

A thin dielectric layer 701 is then deposited over the resulting structure. In one embodiment, this thin dielectric layer 701 is tetra-ethoxy-silane oxide (TEOS), having a thickness in the range of about 100 to 200 Angstroms. A polysilicon layer or a layer of amorphous silicon having a thickness in the range of about 200 to 1000 Angstroms is then deposited over thin dielectric layer 701. This polysilicon layer is then etched back, thereby creating polysilicon sidewall spacers 702-704, as illustrated in FIG. 8E. At this time, a conventional pre-metal dielectric layer (not shown) can be formed over the resulting structure. During subsequent processing steps (i.e., during formation of the multi-layer interconnect structure), polysilicon word line regions 171 and 181, and polysilicon sidewall spacers 702-704 operate as a light-absorbing structure to block UV radiation from reaching significant portions of substrate 101. That is, the UV radiation will not reach the portions of substrate 101 that have overlying ONO structures. As a result, the electron trapping in ONO structures due to UV radiation is minimized, such that the threshold voltages of the fieldless array transistors do not increase to undesirable levels.

Figure 9A:
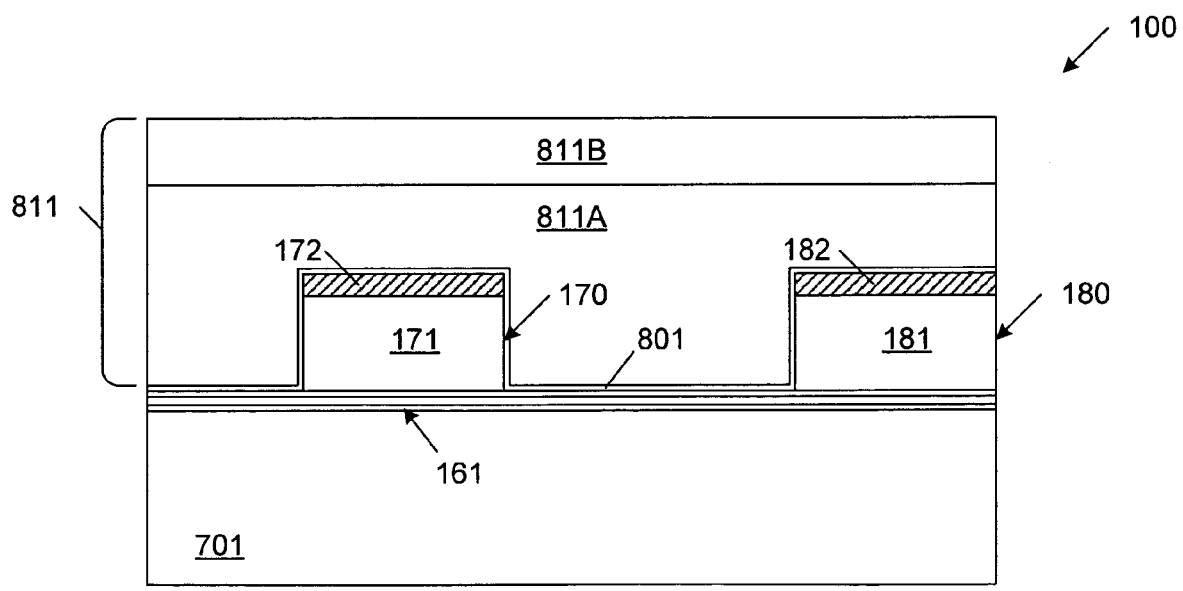
FIGS. 9A-9F are cross sectional views of the fieldless array along section line BB-BB' of FIG. 1 during process steps in accordance with another embodiment of the present invention.

In accordance with another embodiment of the present invention, the ONO structures 161-163 can be left intact, thereby simplifying the process requirements. As illustrated in FIG. 9A, the photoresist regions 1061-1062 of FIG. 8C are stripped, and a thin dielectric barrier layer 801 can be formed over the resulting structure. In the described embodiment, dielectric barrier layer 801 is a silicon nitride layer having a thickness in the range of 100 to 400 Angstroms.

A first pre-metal dielectric layer 811, which includes pre-metal dielectric layers 811A and 811B, is then formed over silicon nitride barrier layer 801, as illustrated in FIG. 9A. In the described embodiment, pre-metal dielectric layer 811A is USG or BPSG, deposited to a thickness in the range of 500 to 8000 Angstroms. However, other dielectric materials, having other thicknesses can be used in other embodiments.

In accordance with one embodiment, pre-metal dielectric layer 811A is planarized, e.g., by CMP. This is done such that the surface of a subsequently formed light-absorbing layer (described below) is reached at the same time during a subsequent contact etch, in case of aggressive topologies.

In the case where BPSG is used to implement the pre-metal dielectric layer 811A, another pre-metal dielectric layer 811B, which includes TEOS or another $SiO_2$ dielectric layer, is deposited to a thickness of 200-1000 Angstroms over BPSG layer 811A.

Figure 9B:
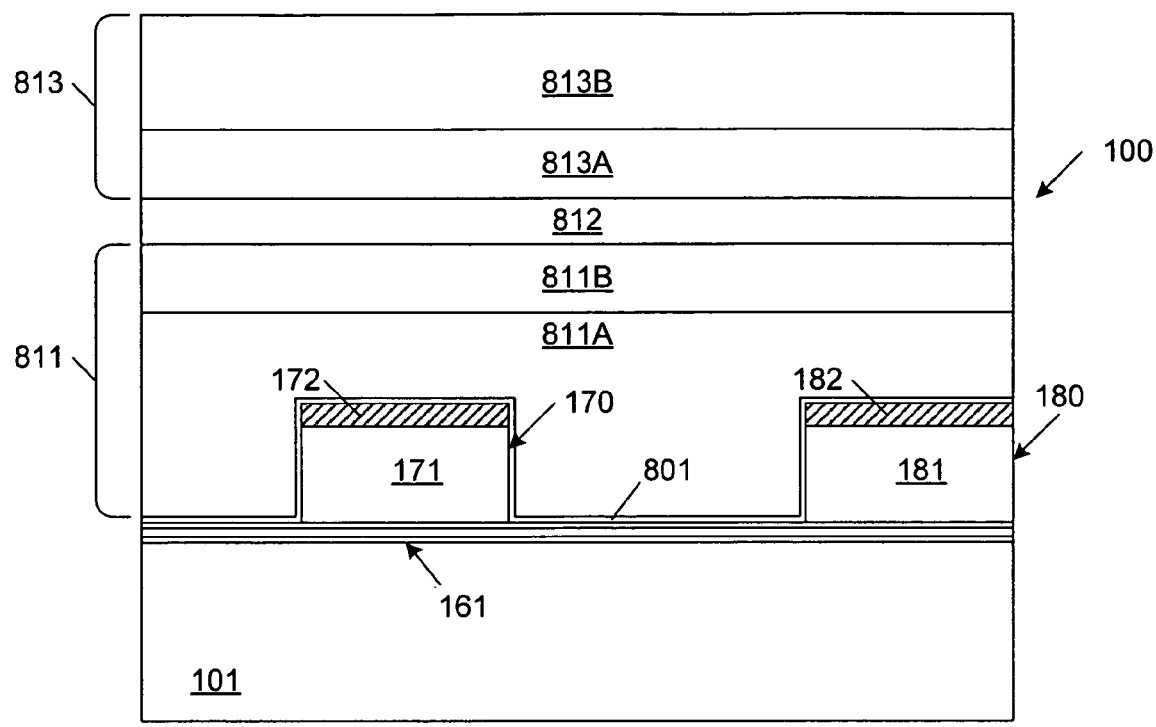

As illustrated in FIG. 9B, a light-absorbing layer 812 is formed over first pre-metal dielectric layer 811. In the described embodiment, light-absorbing layer 812 is a layer of undoped polysilicon or amorphous silicon having a thickness in the range of about 250 to 2500 Angstroms. Polysilicon (or amorphous silicon) layer 812 absorbs UV radiation.

The pre-metal dielectric layer 811B suppresses out-diffusion of impurities from the BPSG layer 811A into the overlying undoped polysilicon layer 812. As a result, the resistance of undoped polysilicon layer 812 is not reduced by such out-diffusion. Note that if pre-metal dielectric layer 811A is made of a dielectric material that does not result in significant out-diffusion, the pre-dielectric layer 811B may be eliminated. A second pre-metal dielectric layer 813, which includes pre-metal dielectric layers 813A and 813B, is formed over light-absorbing layer 812, as illustrated in FIG. 9B. In the described embodiment, pre-metal dielectric layer 813A includes TEOS or another $SiO_2$ dielectric layer, which is deposited to a thickness of 200-1000 Angstroms over polysilicon layer 812. Pre-metal dielectric layer 813B can be BPSG, deposited to a thickness in the range of 500 to 8000 Angstroms. Pre-metal dielectric layer 813A suppresses out-diffusion of impurities from the overlying BPSG layer 813B into the underlying undoped polysilicon layer 812. As a result, the resistance of undoped polysilicon layer 812 is not reduced by such out-diffusion. Note that if pre-metal dielectric layer 813BA is made of a dielectric material that does not result in significant out-diffusion, the pre-dielectric layer 813A may be eliminated.

The upper surface of BPSG layer 813B is planarized, e.g., by CMP. Other dielectric materials can be used to form second pre-metal dielectric layer 813 in other embodiments. The combined thickness of layers 801 and 811-813 is approximately equal to the thickness of a conventional pre-metal dielectric structure.

Figure 9C:
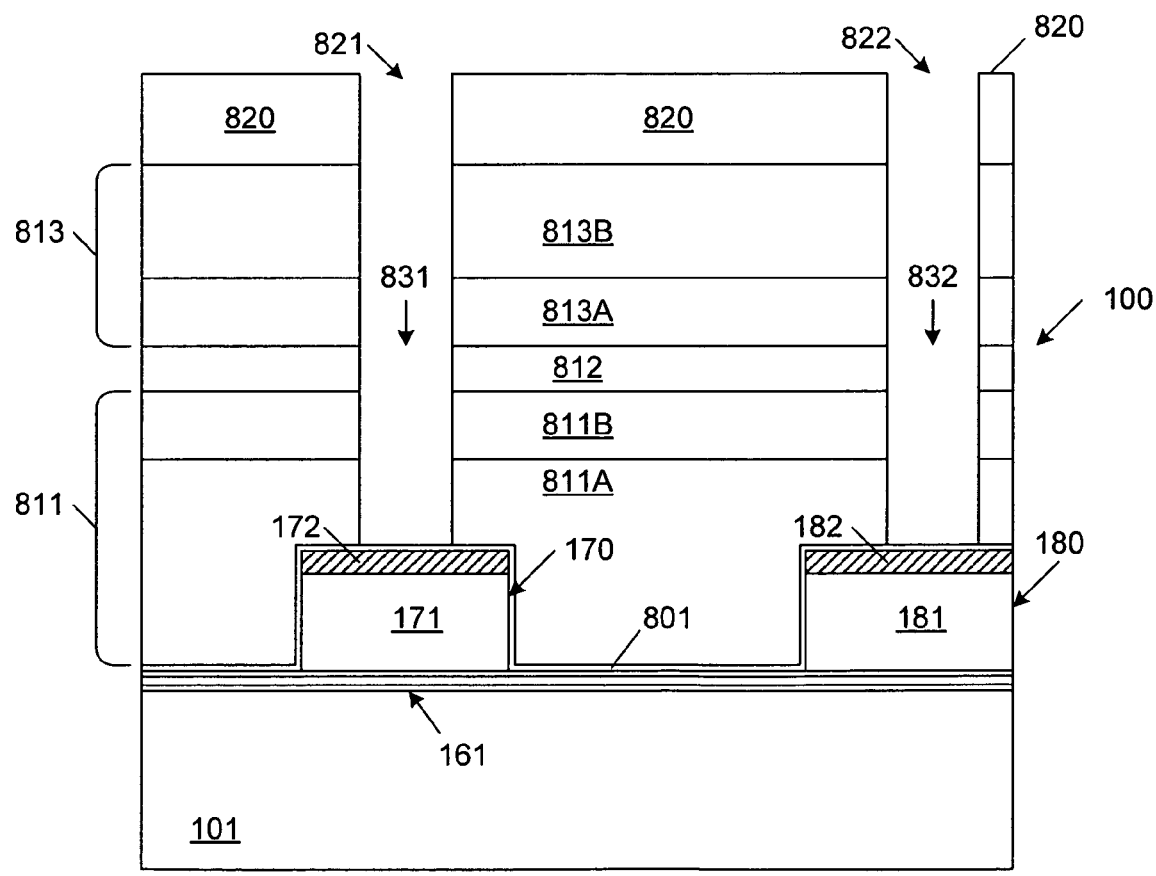

As illustrated in FIG. 9C, a photoresist mask 820 having openings 821-822 is formed over second pre-metal dielectric layer 813. Openings 821-822 define the locations of contacts to be formed to underlying circuit elements. A series of etches is performed through openings 821-822, thereby forming contact openings 831-832, as illustrated in FIG. 9C. Contact openings 831-832 extend through second pre-metal dielectric layer 813, polysilicon layer 812 and first pre-metal dielectric layer 811, and stop on silicon nitride layer 801. The reactive ion etch (RIE) recipes are as follow. A $C_5F_8/O_2/Ar$ etch is performed at a pressure of 50 mTorr, a power of 1000 Watts and a time of 100-200 seconds to etch the BPSG/TEOS layers 813A-813B and 811A-811B of the first and second pre-metal dielectric layers 811 and 813. A $C_5F_8/O_2/Ar$ RIE etch is performed at a pressure of 120 mTorr, a power of 100 Watts and a time of 5-15 seconds is performed to etch polysilicon layer 812.

Figure 9D:
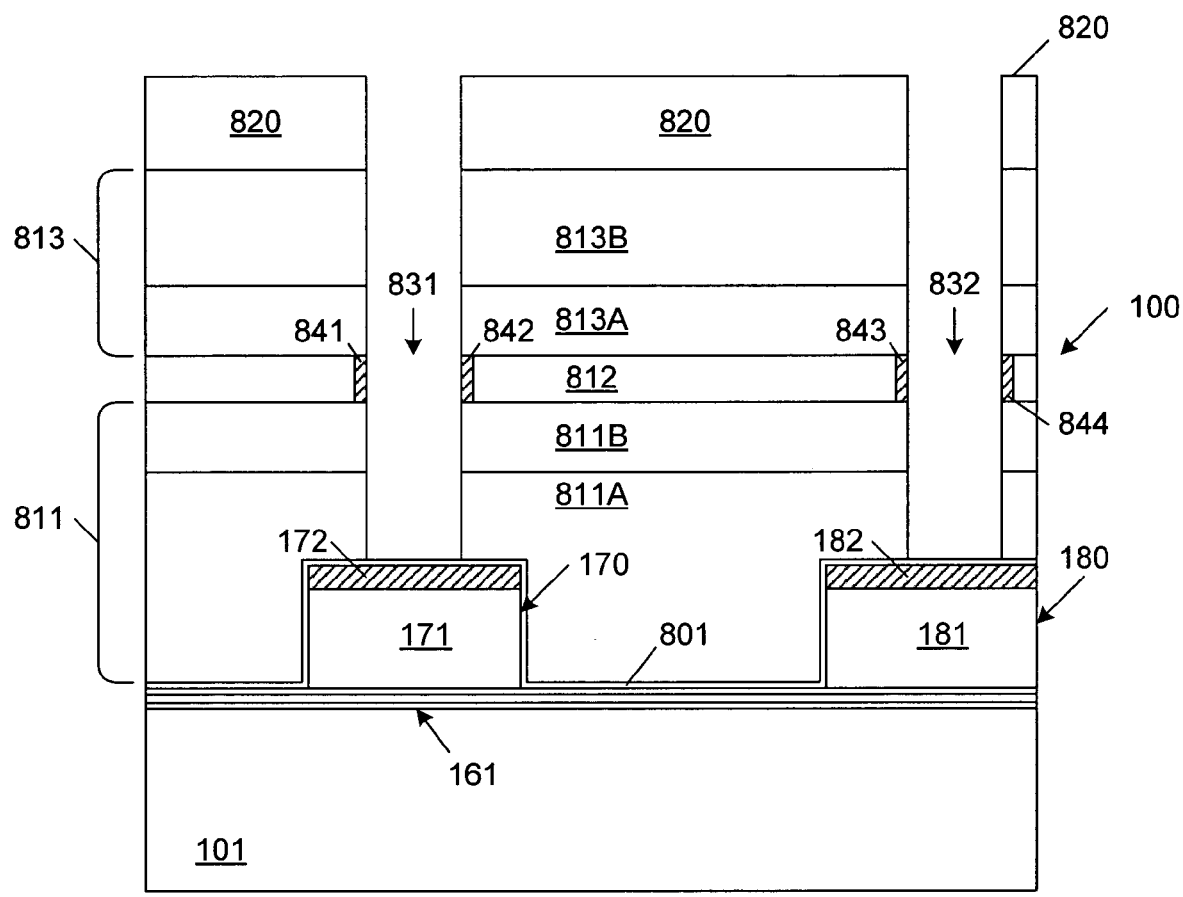

An oxidation step (e.g., 700-750° C. wet oxidation for 5-20 min) is then performed, thereby forming silicon oxide regions 841-844 on the exposed sidewalls of polysilicon layer 812. Silicon oxide regions 841-844 ensure that the subsequently formed contacts are not shorted by polysilicon layer 812. The resulting structure is shown in FIG. 9D.

Figure 9E:
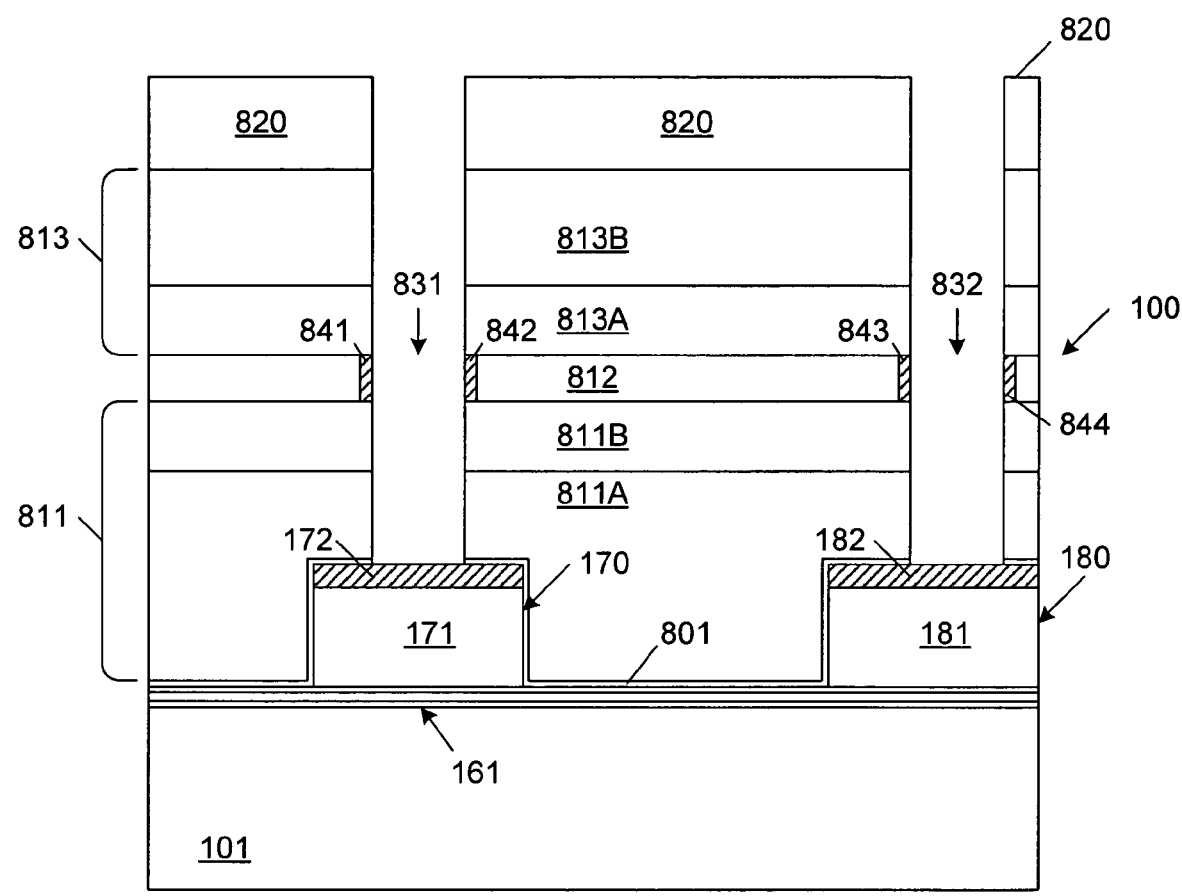

As illustrated in FIG. 9E, a nitride etch is then performed through contact openings 831-832, thereby removing the exposed portions of silicon nitride layer 801. An RIE etch using $CH_2F_2/O_2/Ar$ at a pressure of 50 mTorr, a power of 400 Watts and a time of 10-30 seconds is used to remove the exposed portion of silicon nitride barrier layer 801.

Figure 9F:
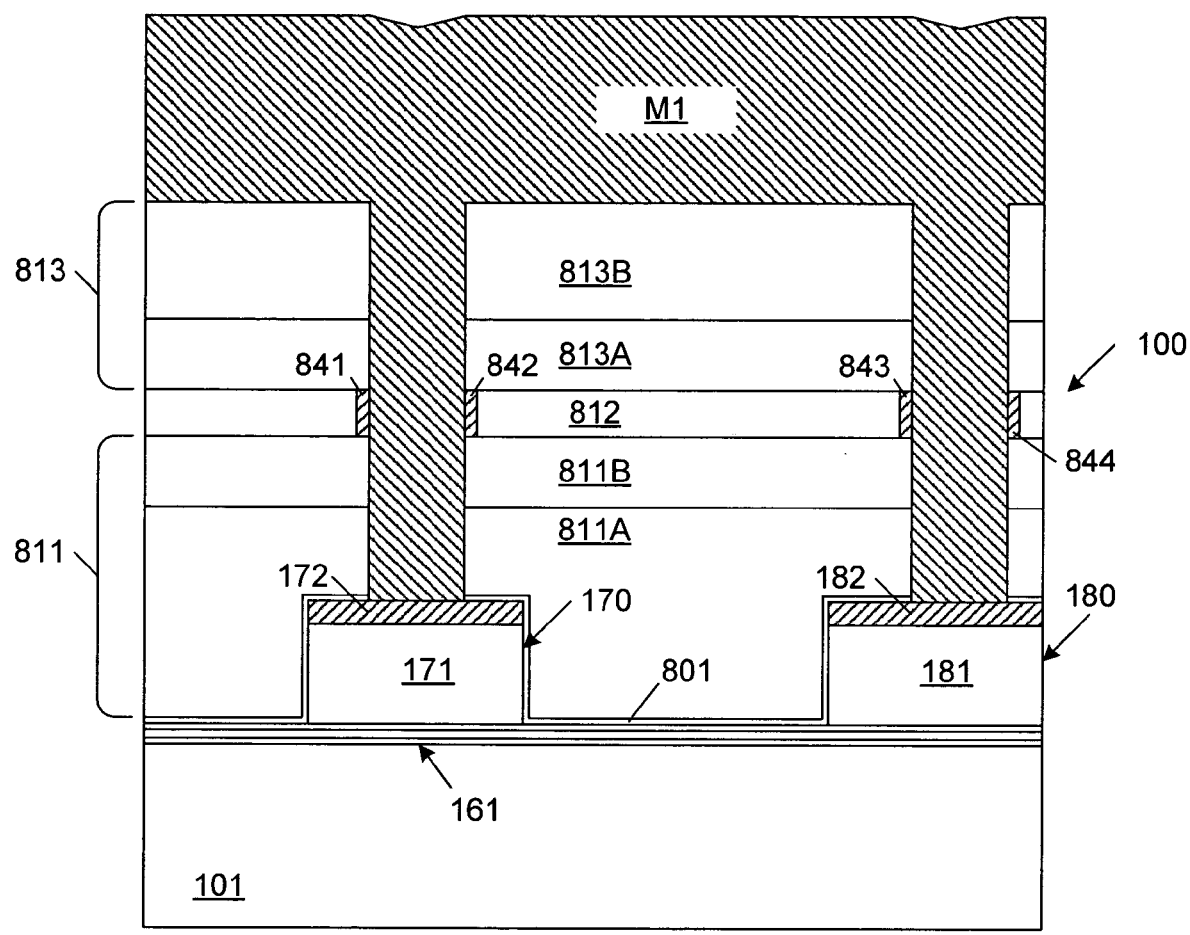

As illustrated in FIG. 9F, photoresist mask 820 is stripped, and the first metal layer (M1) is then deposited over the resulting structure. This metal layer M1 fills contact openings 831-832, thereby providing contacts to the structures (e.g., word lines 170 and 180) exposed by contact openings 831-832. A thin barrier layer (e.g., Ti/TiN) (not shown) can be deposited in the contact openings 831-832 before the first metal layer is deposited. Another photoresist mask (not shown), which defines the desired pattern of the first metal layer is formed over the first metal layer. An etch is performed through this metal-1 photoresist mask, thereby patterning the first metal layer. The metal-1 photoresist mask is then stripped, and the processing continues, with the alternating formation of patterned dielectric layers and patterned metal layers.

Note that after polysilicon layer 812 is formed, the underlying silicon substrate 101 is protected from the UV radiation present during subsequent processing steps. As a result, this UV radiation does not cause electronic charge to be transferred from the substrate 101 to the silicon nitride layer of the ONO structures 161-163. As a result, the threshold voltages of the resulting fieldless array transistors are not undesirably increased in response to the UV radiation.

Figure 10A:
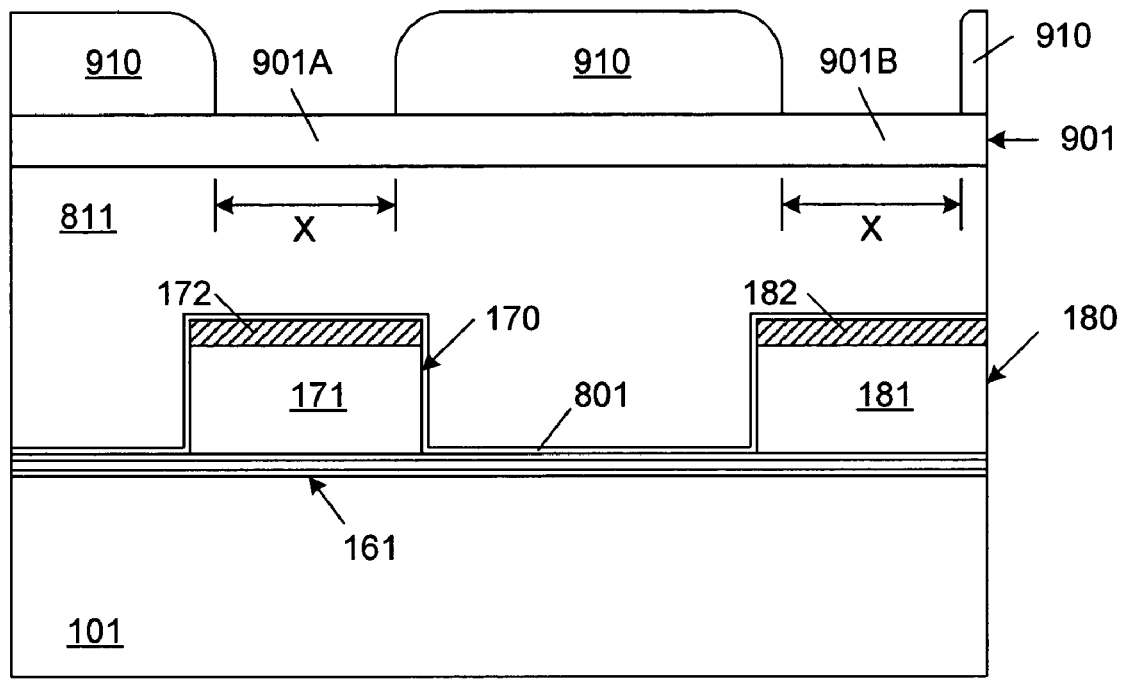
FIGS. 10A-10D are cross sectional views of the fieldless array along section line BB-BB' of FIG. 1 during process steps in accordance with another embodiment of the present invention.

In accordance with another embodiment of the present invention, polysilicon layer 812 can be replaced by a patterned polysilicon layer. FIG. 10A illustrates a polysilicon layer 901, which is patterned in accordance with this embodiment. Similar elements in FIGS. 9A and 10A are labeled with similar reference numbers. Polysilicon layer 901 is deposited to a thickness in the range of about 250 to 2500 Angstroms over first pre-metal dielectric layer 811. A photoresist mask 910 is formed over this polysilicon layer 901.

Figure 10B:
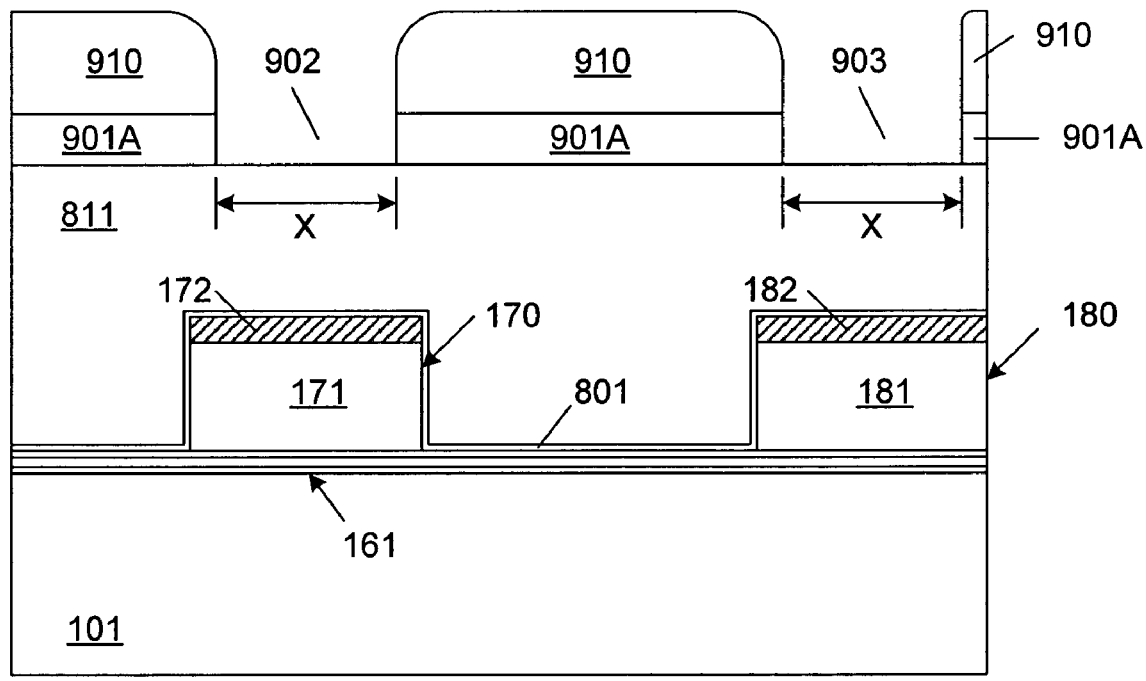

As illustrated in FIG. 10B, polysilicon layer 901 is etched through the openings of photoresist mask 910, thereby forming patterned polysilicon layer 901A. Patterned polysilicon layer 901A includes openings 902 and 903, which are located over word lines 170 and 180, respectively. As described in more detail below, contacts are made to the underlying word lines 170 and 180 through openings 902 and 903, respectively. Patterned polysilicon layer 901A also includes openings (not shown) over the diffusion bit lines 141-143 of the fieldless array, wherein contacts are made to the underlying diffusion bit lines through these openings. Patterned polysilicon layer 901A is removed at locations that are not located over the fieldless array (e.g., over locations where CMOS circuitry is formed in substrate 101).

Figure 10C:
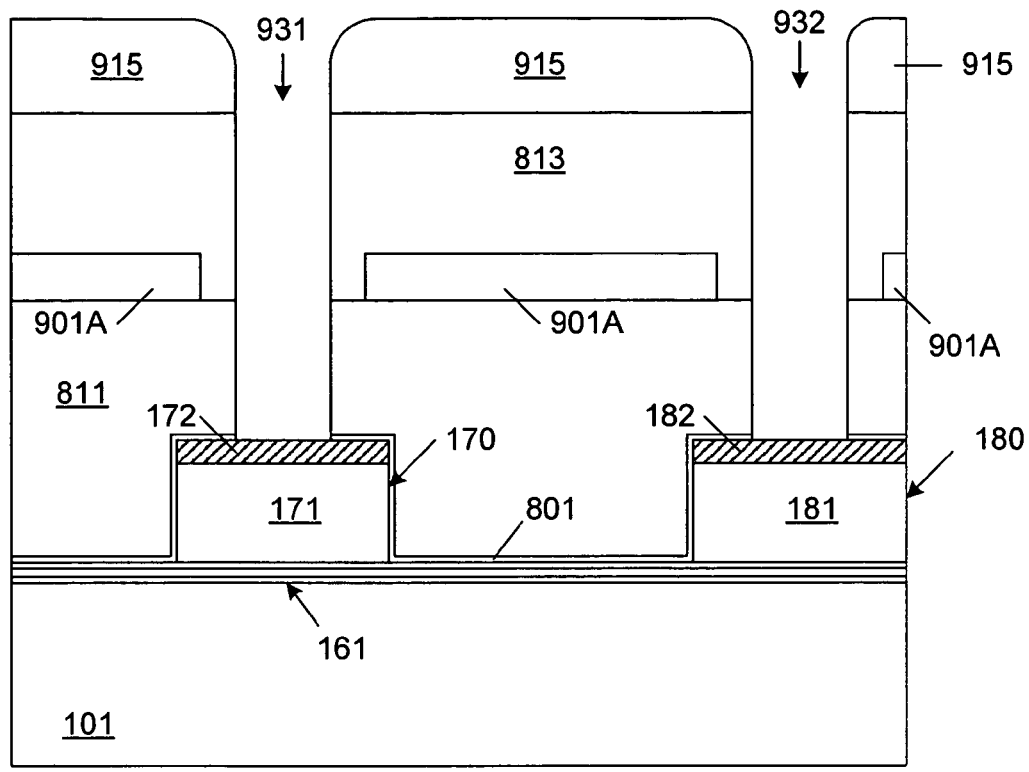

As illustrated in FIG. 10C, photoresist mask 910 is stripped, and second pre-metal dielectric layer 813 is formed over the resulting structure. Another photoresist mask 915 is formed over second pre-metal dielectric layer 813. Photoresist mask 915 defines the locations of contacts to be formed through the first and second pre-metal dielectric layers 811 and 813 (including both word line contacts and bit line contacts). An etch is performed through the openings of photoresist mask 915, thereby creating contact openings 931-932. These contact openings 931-932 are located entirely within the openings formed in patterned polysilicon layer 901A, such that patterned polysilicon layer 901A is not exposed during the contact etch.

Figure 10D:
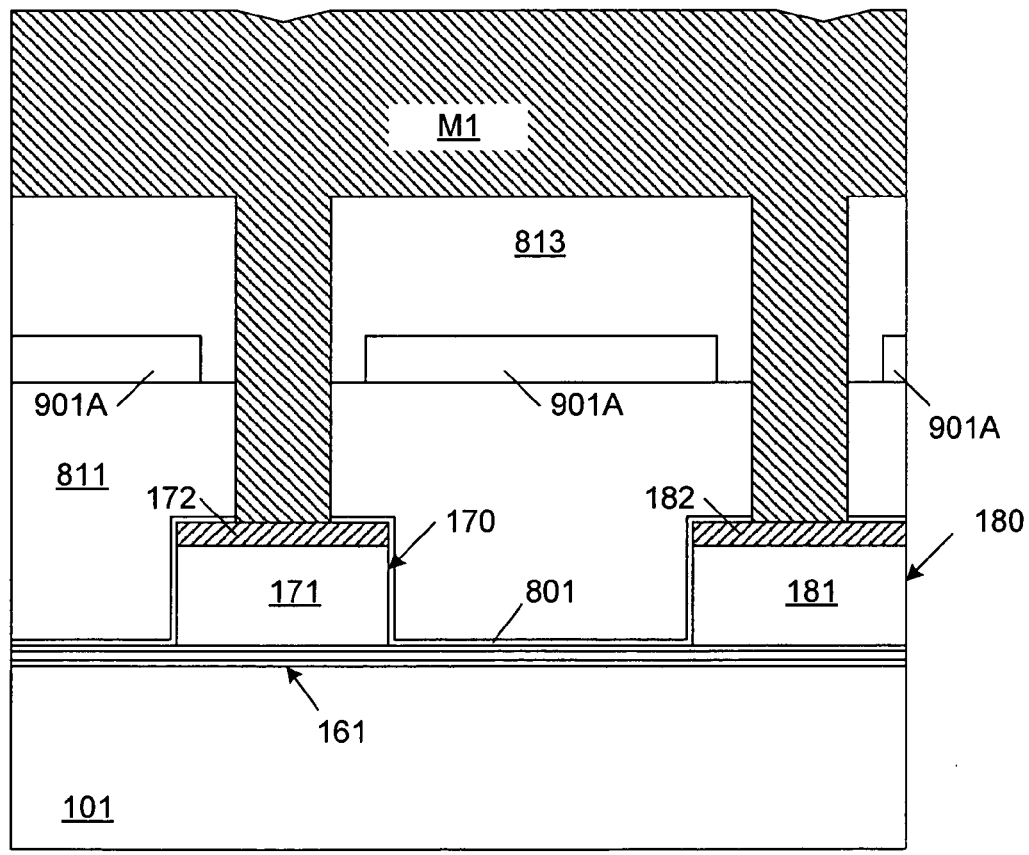

As illustrated in FIG. 10D, photoresist mask 915 is stripped, the first metal layer (M1) is then deposited over the resulting structure. This metal layer M1 fills contact openings 931-932, thereby providing contacts to word lines 170 and 180, which are exposed by contact openings 931-932. Another photoresist mask (not shown), which defines the desired pattern of the first metal layer, is formed over the first metal layer. An etch is performed through this metal-1 photoresist mask, thereby patterning the first metal layer. The metal-1 photoresist mask is then stripped, and the processing continues, with the alternating formation of patterned dielectric layers and patterned metal layers.

The contacts formed by the first metal layer M1 pass through the openings in patterned polysilicon layer 901A to contact the underlying word lines and bit lines. These contacts do not touch patterned polysilicon layer 901A. Each of the openings in patterned polysilicon layer 901A is designed to have a width "X", which is determined by the minimum design rules. For example, the width "X" of the openings in patterned polysilicon layer 901A can be 0.26 microns for a 0.18 micron process. This width is selected to ensure that patterned polysilicon layer 901A exhibits significant coverage over first pre-metal dielectric layer 811, while also allowing contact openings 931-932 to be formed without exposing patterned polysilicon layer 901A.

Figure 10E:
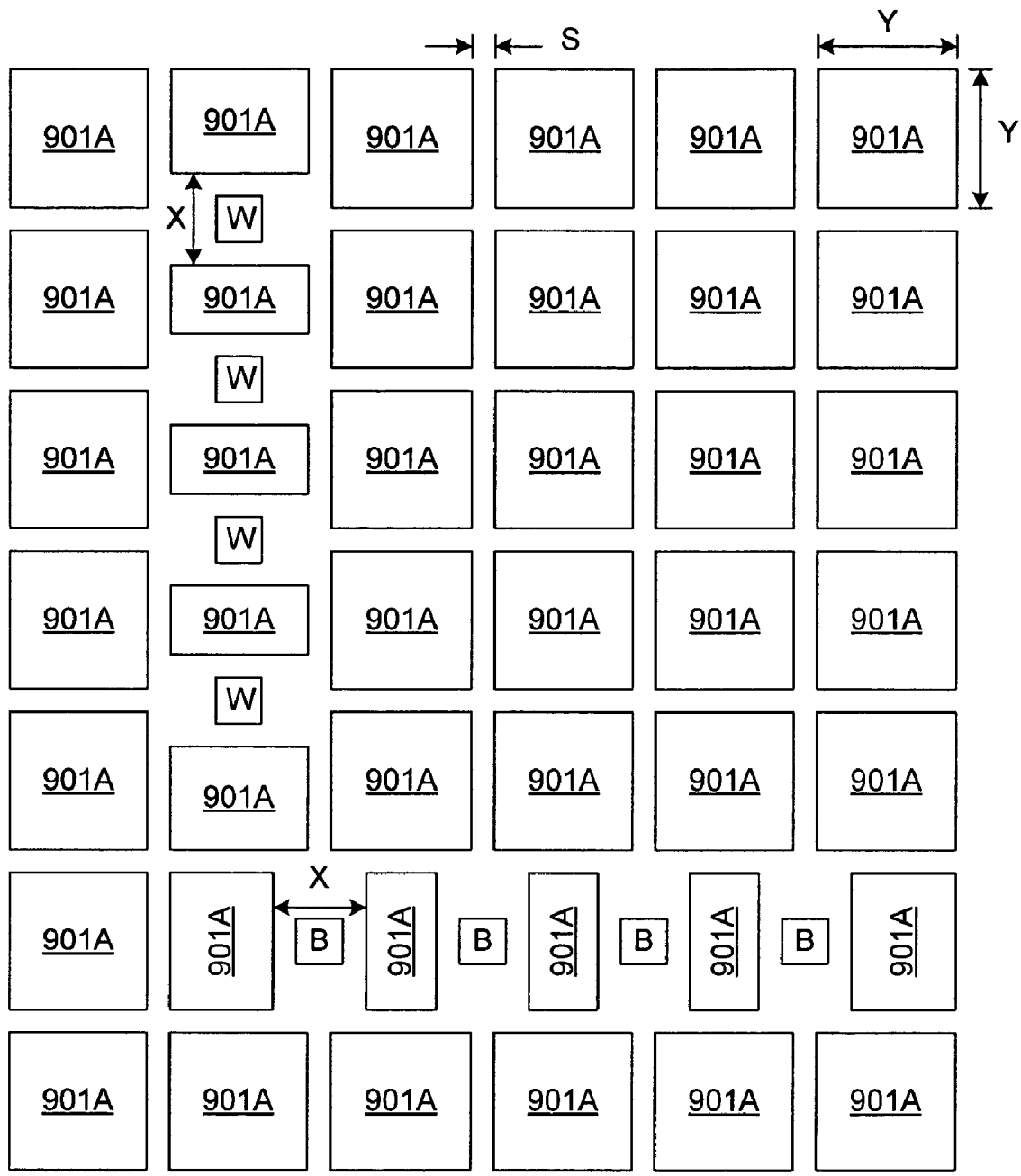
FIG. 10E is a top view of a patterned polysilicon layer for blocking UV light in accordance with one embodiment of the present invention.

In accordance with one variation of the present embodiment, patterned polysilicon layer 901A is patterned into a plurality of polysilicon islands. FIG. 10E is a top view of a patterned polysilicon layer 901A formed of a plurality of polysilicon islands. Contact openings for four associated word lines, which are located between polysilicon islands, are shown as boxes containing the letter "W". Similarly, contact openings for four associated bit lines, which are located between polysilicon islands, are shown as boxes containing the letter "B". In one embodiment, most of these polysilicon islands can be a square having a width "Y" of about 1 to 20 microns. The space "S" between the polysilicon islands is determined by the minimum design rules. For example, the space S between adjacent polysilicon islands can be 0.26 microns for a 0.18 micron process. Using the minimum design rules ensures that patterned polysilicon layer 901A exhibits significant coverage over first pre-metal dielectric layer 811.

In the present embodiment, portions of second pre-metal dielectric layer 813 are located between the polysilicon islands of patterned polysilicon layer 901. As a result, the resistance between these polysilicon islands is relatively high (i.e., higher than the resistance of a continuous polysilicon layer). While patterned polysilicon layer 901A advantageously provides a high resistance between the polysilicon islands, patterned polysilicon layer 901A does not provide the same level of UV protection as solid polysilicon layer 812. Moreover, patterned polysilicon layer 901A requires an additional mask.

Figure 11A:
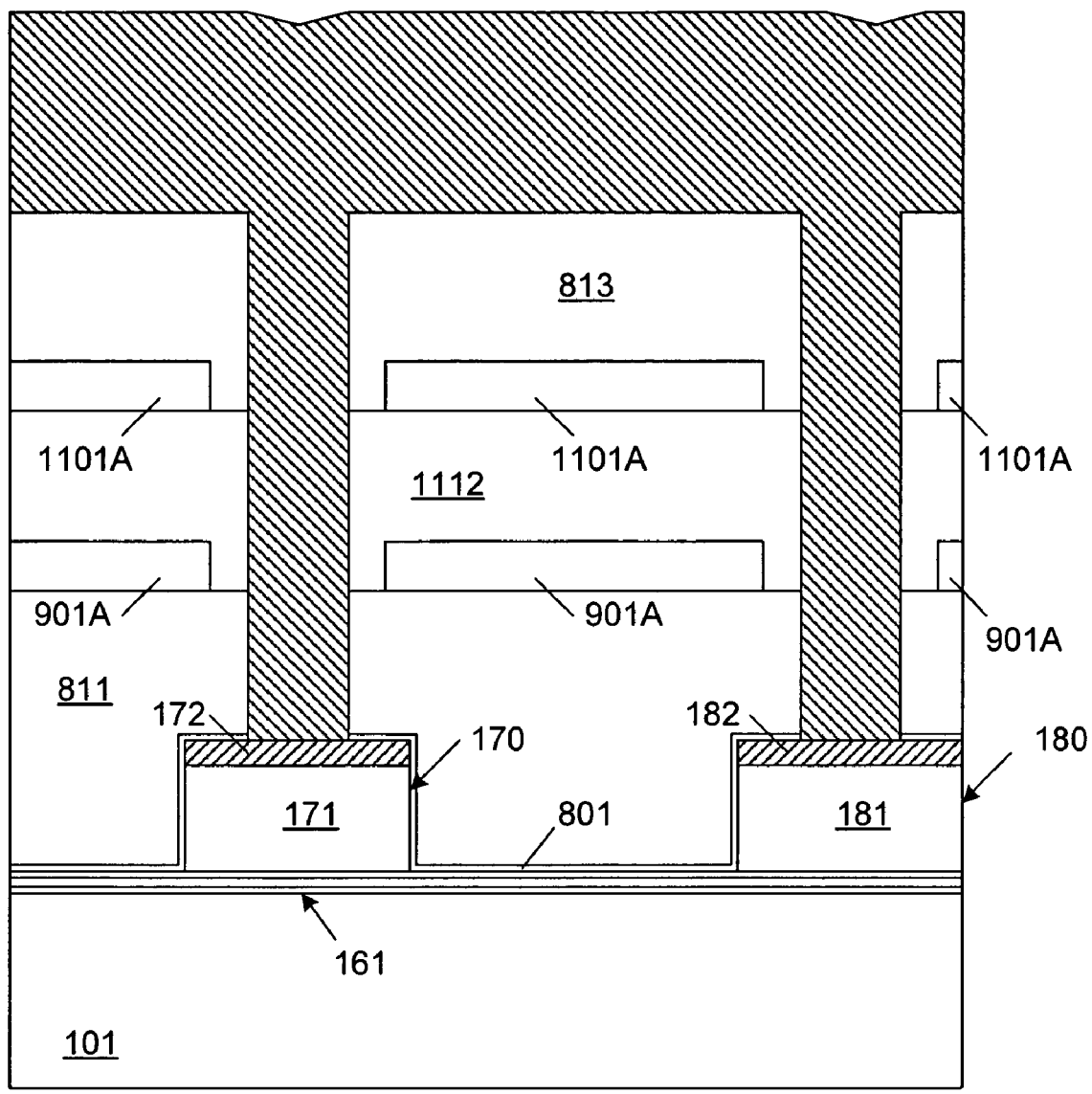
FIG. 11A is a cross sectional view of the fieldless array along section line BB-BB' of FIG. 1 in accordance with another embodiment of the present invention.
Figure 11B:
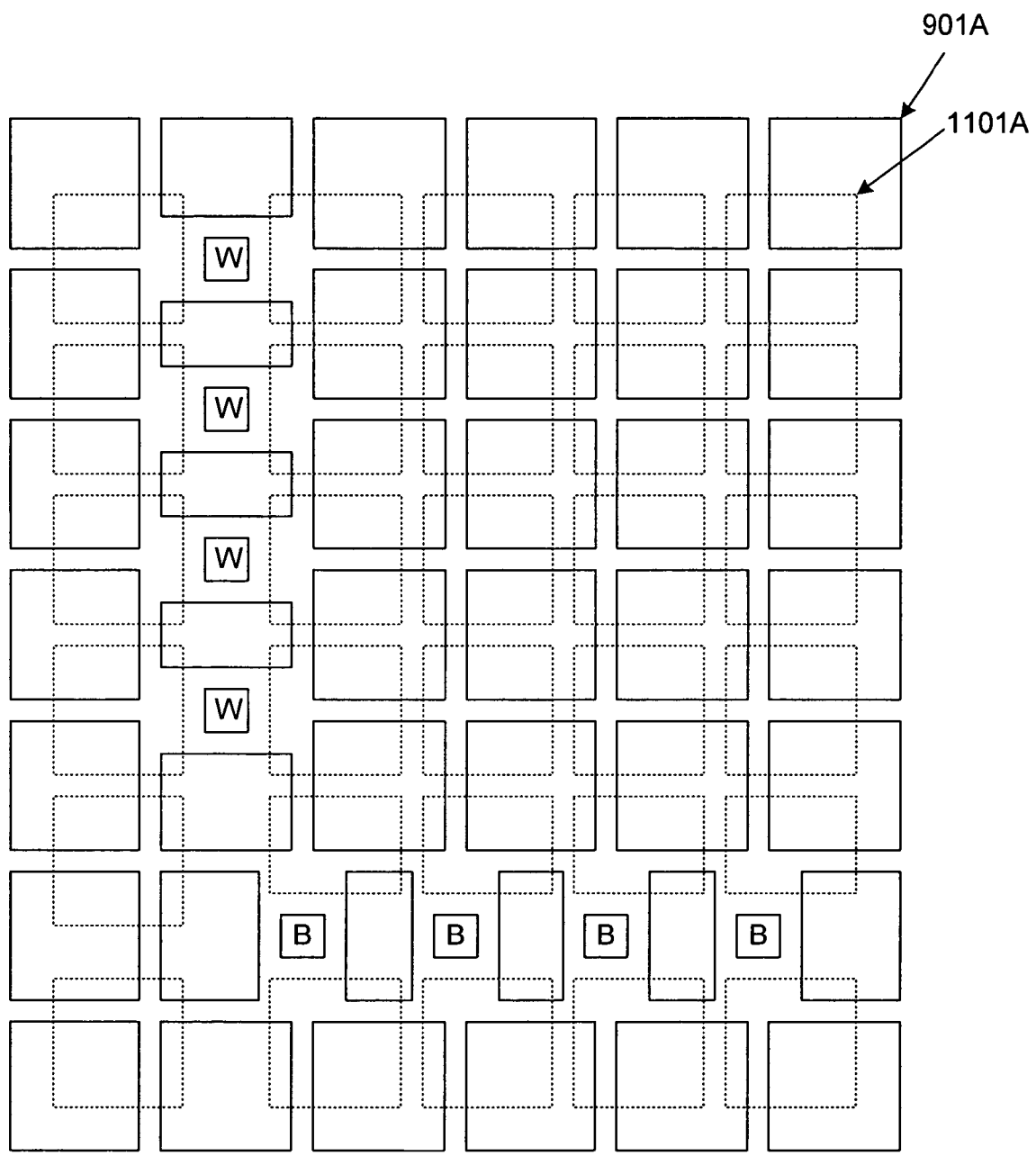
FIG. 11B is a top view of two horizontally-shifted patterned polysilicon layers for blocking UV light in accordance with another embodiment of the present invention.

In yet another embodiment, which is illustrated in FIGS. 11A and 11B, combinations of two or more horizontally shifted patterned polysilicon layers are used for more efficient UV blocking. Similar elements in FIGS. 10D and 11A are labeled with similar reference numbers. Thus, FIG. 11A includes first pre-metal dielectric layer 811 and patterned polysilicon layer 901A. Patterned polysilicon layer 901A includes a plurality of polysilicon islands, as illustrated in FIG. 10E. In addition, the structure of FIG. 11A includes a second patterned polysilicon layer 1101A, which also includes a plurality of polysilicon islands. Intermediate pre-metal dielectric layer 1112 separates the first and second patterned polysilicon layers 901A and 1101A. Intermediate pre-metal dielectric layer 1112 is formed over patterned polysilicon layer 901A.

Second patterned polysilicon layer 1101A is formed over intermediate pre-metal dielectric layer 1112 in the same manner as first patterned polysilicon layer 901A. However, second patterned polysilicon layer 1101A is horizontally shifted with respect to the first patterned polysilicon layer 901A. This horizontal shifting is performed such that there is maximum coverage provided by the polysilicon islands of these patterned polysilicon layers 901A-1101A. FIG. 11B is a top view of patterned polysilicon layers 901A and 1101A in accordance with one embodiment of the present invention. In FIG. 11B, the polysilicon islands of patterned polysilicon layer 901A is shown in solid lines, and the polysilicon islands of patterned polysilicon layer 1101A are shown in dashed lines. Other alignments are possible in other embodiments. Second pre-metal dielectric layer 813 is formed over second patterned polysilicon layer 1101A. Note that the contact openings formed through pre-metal dielectric layers 811, 813 and 1112 do not expose patterned polysilicon layers 901A or 1101A. As a result, the metal-1 contacts do not touch these patterned polysilicon layers 901A or 1101A.

The pre-metal dielectric structure of FIGS. 11A-11B advantageously provide a high resistance between the various polysilicon islands, and provide for improved UV blocking with respect to the pre-metal dielectric structure of FIGS. 10A-10E. However, the pre-metal dielectric structure of FIGS. 11A-11B requires additional masks to form patterned polysilicon layers 1101 and 1102.

Figure 12:
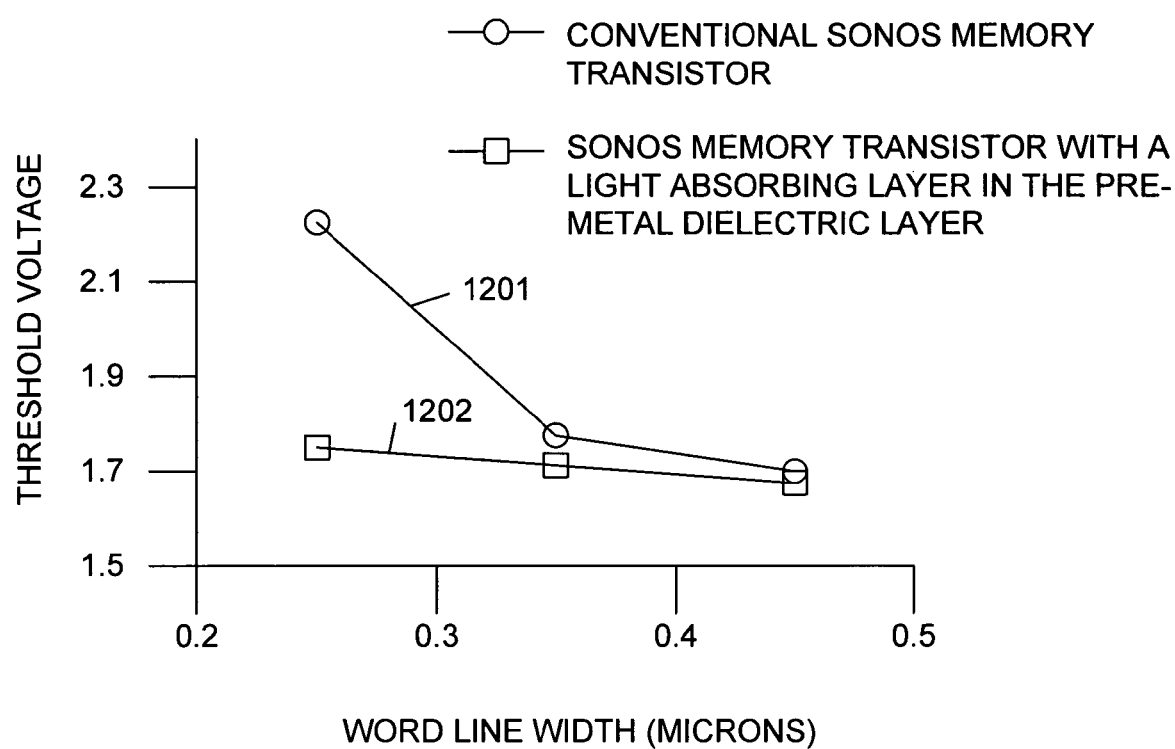
FIG. 12 is a graph that illustrates the threshold voltage of a conventional fieldless array transistor as a function of transistor width, and the threshold voltage of a fieldless array transistor in accordance with the present invention as a function of transistor width.

FIG. 12 is a graph that illustrates the improved threshold voltages associated with the present invention. More specifically, line 1201 of FIG. 12 illustrates the threshold voltage of a conventional fieldless array transistor as a function of transistor width. Line 1202 of FIG. 12 illustrates the threshold voltage of a SONOS memory transistor having a light-absorbing layer in the pre-metal dielectric structure, as a function of transistor width. Advantageously, the threshold voltage of a SONOS memory transistor having a light-absorbing layer in the pre-metal dielectric structure is on the order of 0.5 Volts lower than the threshold voltage of a conventional SONOS memory transistor as the transistor width approaches 0.25 microns.

Although the invention has been described in connection with several embodiments, it is understood that this invention is not limited to the embodiments disclosed, but is capable of various modifications, which would be apparent to a person skilled in the art. For example, it is understood that the polysilicon spacers illustrated in FIG. 8E can be combined with the light-absorbing layers 812, 901, or 1101-1102 in various embodiments of the present invention. Moreover, although only two patterned polysilicon layers 1101-1102 were described in connection with FIGS. 11A-11B, it is understood that other numbers of polysilicon layers can be used in other embodiments. In addition, other types of UV light-absorbing layers can be used, e.g., amorphous silicon, strongly silicon enriched oxides and nitrides or oxides and nitrides containing silicon clusters. In addition, the various described p-type regions can be interchanged with the described n-type regions to provide similar results. Thus, the invention is limited only by the following claims.

We claim:

1. A silicon-oxide-nitride-oxide-silicon (SONOS) memory transistor comprising:
    a semiconductor region having a first conductivity type;
    a plurality of oxide-nitride-oxide (ONO) structures formed over the upper surface of the semiconductor region;
    a plurality of word lines formed over the ONO structures, wherein each of the ONO structures is entirely covered by one of the word lines;
    a first dielectric layer located over the plurality of word lines and the semiconductor region; and
    light-absorbing sidewall spacers located over the first dielectric layer, and adjacent to sidewalls of the word lines.

2. The SONOS memory transistor of claim 1, wherein the light-absorbing sidewall spacers comprise polycrystalline silicon.

3. The SONOS memory transistor of claim 1, wherein the word lines comprise polycrystalline silicon.

4. The SONOS memory transistor of claim 1, wherein the first dielectric layer comprises tetra-ethoxy-silane (TEOS).

5. A method of fabricating a fieldless array, the method comprising:
    forming an oxide-nitride-oxide (ONO) layer over a surface of a semiconductor region;
    patterning the ONO layer to create a first set of ONO structures that define locations for a plurality of diffusion bit lines of the fieldless array;
    forming a plurality of word lines over the first set of ONO structures; and
    patterning the first set of ONO structures, thereby creating a second set of ONO structures, wherein the second set of ONO structures are located entirely under the plurality of word lines,
    forming a first dielectric layer over the word lines and the semiconductor region; and
    forming light-absorbing sidewall spacers over the first dielectric layer and adjacent to sidewalls of the word lines.

6. The method of claim 5, wherein the light-absorbing sidewall spacers comprise polycrystalline silicon.

7. The method of claim 5, wherein the word lines comprise polycrystalline silicon.

8. The method of claim 5, wherein the first dielectric layer comprises tetra-ethoxy-silane (TEOS).

* * * * *